(12) United States Patent
Sirringhaus et al.

(10) Patent No.: US 7,244,669 B2
(45) Date of Patent: Jul. 17, 2007

(54) PATTERNING OF DEVICES

(75) Inventors: Henning Sirringhaus, Cambridge (GB); Paul Alan Cain, Hertford (GB)

(73) Assignee: Plastic Logic Limited, Cambridge (GB)

( * ) Notice: Subject to any disclaimer, the term of this patent is extended or adjusted under 35 U.S.C. 154(b) by 0 days.

(21) Appl. No.: 10/478,669

(22) PCT Filed: May 22, 2002

(86) PCT No.: PCT/GB02/02405

§ 371 (c)(1),
(2), (4) Date: Aug. 26, 2004

(87) PCT Pub. No.: WO02/095805

PCT Pub. Date: Nov. 28, 2002

(65) Prior Publication Data

US 2004/0266207 A1 Dec. 30, 2004

(30) Foreign Application Priority Data

| May 23, 2001 | (GB) | ................................... 0112611.9 |
| Jul. 2, 2001 | (GB) | ................................... 0116174.4 |

(51) Int. Cl.
*H01L 21/26* (2006.01)
*H01L 21/42* (2006.01)

(52) U.S. Cl. .................. 438/535; 438/57; 438/487; 257/E21; 257/596; 257/E25; 257/4

(58) Field of Classification Search ............... 438/535, 438/981, 725, 758, 31, 32, 57, 59
See application file for complete search history.

(56) References Cited

U.S. PATENT DOCUMENTS

| 4,807,218 A | * | 2/1989 | Gerber ...................... 369/100 |
| 5,178,989 A | * | 1/1993 | Heller et al. ................. 430/323 |
| 5,643,427 A | * | 7/1997 | Kobayashi et al. ....... 204/298.2 |
| 5,688,719 A | * | 11/1997 | Tsai et al. .................... 438/780 |
| 6,208,369 B1 | * | 3/2001 | Oren et al. .................. 347/244 |
| 6,488,872 B1 | * | 12/2002 | Beebe et al. .................. 264/31 |
| 6,606,413 B1 | * | 8/2003 | Zeineh ........................ 382/232 |
| 6,849,334 B2 | * | 2/2005 | Horne et al. ................. 428/402 |
| 6,919,158 B2 | * | 7/2005 | Kawamura et al. ....... 430/270.1 |

FOREIGN PATENT DOCUMENTS

| EP | 0 773 479 A1 | 5/1997 |
| WO | WO 01/20691 A1 | 3/2001 |

OTHER PUBLICATIONS

Wong T K S et al: "Pattering of poly(3-alkylthiophene) thin films by direct-write ultraviolet laser lithography" Materials Science and Engineering B., Elsevier Sequoia, Lausanne, CH, vol. 55, No. 1-2, Aug. 14, 1998 pp. 71-78, XP004142052 ISSN: 0921-5107: Figures 1,3, Abstract.

De Leeuw D M et al: "Polymeric integrated circuits and light-emitting diodes" Electron Devices Meeting, 1997. Technical Digest., International Washington, DC USA Dec. 7-10, 1997, New York, NY USA, IEEE, US , Dec. 12, 1997 pp. 331-336, XP010265518; ISBN:0-7803-4100-7.

Lowe J et al, "Poly(3-(2-Acetoxyethyl) Thiophene): a Model Polymer for Acid-Catalyzed Lithography": Synthetic Metals Elsevier Sequoia, Lausanne, CH, vol. 85, 1997, pp. 1427-1430, XP000826731 ISSN: 0379-6779 Figure II.

(Continued)

*Primary Examiner*—David Nhu
(74) *Attorney, Agent, or Firm*—Sughrue Mion, PLLC

(57) ABSTRACT

A method for forming an organic or partly organic switching device, comprising: depositing layers of conducting, semi-conducting, insulating, or surface modifying layers by solution processing and direct printing; and defining high-resolution patterns of these layers by exposure to a focused laser beam.

57 Claims, 23 Drawing Sheets

OTHER PUBLICATIONS

Colle M et al: "(Patterning of organic light-emitting diodes containing a layer of perylene derivative using an He-Ne laser": 2$^{ND}$ International Conference on Electroluminescence of Molecular Materials and Related Phenomena, Sheffield, UK, May 15-18, 1999, vol. 111-112, pp. 95-97, XP001104048: Synthetic Metals, Jun. 1, 2000, Elsevier, Switzerland ISSN: 0379-6779.

Patterning of Poly (3-Alkylthiophene) Thin Films by Direct-Write Ultraviolet Laser Lithography (1998) 71-78.

* cited by examiner (a)

PATTERNING OF DEVICES

This application is a 371 of PCT/GB02/02405 filed May 22, 2002.

BACKGROUND OF THE INVENTION

1. Field of the Invention

This invention relates to devices such as organic electronic devices and methods for forming such devices.

2. Description of Related Art

Semiconducting conjugated polymer thin-film transistors (TFTs) have recently become of interest for applications in cheap, logic circuits integrated on plastic substrates (C. Drury, et al., APL 73, 108 (1998)) and optoelectronic integrated devices and pixel transistor switches in high-resolution active-matrix displays (H. Sirringhaus, et al., Science 280, 1741 (1998), A. Dodabalapur, et al. Appl. Phys. Lett. 73, 142 (1998)). In test device configurations with a polymer semiconductor and inorganic metal electrodes and gate dielectric layers high-performance TFTs have been demonstrated. Charge carrier mobilities up to 0.1 $cm^2/Vs$ and ON-OFF current ratios of $10^6$–$10^8$ have been reached, which is comparable to the performance of amorphous silicon TFTs (H. Sirringhaus, et al., Advances in Solid State Physics 39, 101 (1999)).

One of the advantages of polymer semiconductors is that they lend themselves to simple and low-cost solution processing. However, fabrication of all-polymer TFT devices and integrated circuits requires the ability to form lateral patterns of polymer conductors, semiconductors and insulators. Various patterning technologies such as photolithography (WO 99/10939 A2), screen printing (Z. Bao, et al., Chem. Mat. 9, 1299 (1997)), soft lithographic stamping (J. A. Rogers, Appl. Phys. Lett. 75, 1010 (1999)) and micro-moulding (J. A. Rogers, Appl. Phys. Lett. 72, 2716 (1998)), as well as direct ink-jet printing (H. Sirringhaus, et al., UK 0009911.9) have been demonstrated.

Many direct printing techniques are unable to provide the patterning resolution that is required to define the source and drain electrodes of a TFT. In order to obtain adequate drive current and switching speed channel lengths of less than 10 µm are required. In the case of inkjet printing the achievable resolution is limited to 20–50 µm by accidental variations of the droplet flight direction caused by changing ejection conditions at the nozzle and by the uncontrolled spreading of the droplets on the substrate.

This resolution limitation has been addressed by printing onto a prepatterned substrate containing regions of different surface free energy (H. Sirringhaus et al., UK 0009915.0). When water-based ink droplets of a conducting polymer are printed onto a substrate containing narrow regions of repelling, hydrophobic surface structure the spreading of droplets can be confined and transistor channels with a channel length of only 5 □m can be defined without accidental short between source and drain electrodes. The hydrophobic barrier can be defined in several ways, for example, by photolithography of a hydrophobic polymer or by soft lithographic stamping of a self-assembled monolayer.

SUMMARY OF THE INVENTION

Embodiments of the present invention relate to methods by which electroactive polymer patterns for definition of transistor devices can be printed with micrometer resolution by direct laser imaging techniques. The method is based on scanning an array of laser beams focussed onto the substrate. The focussed light spots induce local changes of the properties of an electroactive polymer layer or of a surface modification template layer. Several methods are demonstrated herein by which such local changes can be used to produce a high-resolution pattern of an electroactive polymer. In a preferred embodiment of the invention the laser light is of infrared wavelength and induces local heating effects. However, preferably the local temperature of the substrate in the region exposed to the beam does not exceed 120.degree. C. during exposure to the beam. Alternatively, the light can be of visible or ultraviolet wavelength inducing local changes of chemical structure or local activation of molecules upon absorption of a photon. Infrared light is particularly useful when sharp edge definition or small light-induced degradation of the film to be patterned is necessary. On the other hand visible or ultraviolet light is useful when high spatial resolution is required approaching the diffraction limit which is on the order of the wavelength of the light.

Computer-to-plate (CTP) imaging techniques are used in the graphic arts industry to produce printing plates for offset printing. Printing plates are made of aluminium or polyester and are coated with suitable light-sensitive layers. They need to be prepared with hydrophilic, non-image surface regions that repel the ink, and lipophilic image regions that attract the ink. On the press the hydrophilic regions are dampened with a water-based fountain solution. In a typical prepress platesetter the plate coating is exposed using an array of laser spots. Earlier CTP system used ultraviolet and visible light, in recent years thermal imaging using arrays of infrared laser spots (common wavelengths are 830 nm or 1046 nm) have become more widespread due to its better image definition and reduced sensitivity to day or room light exposure. Several techniques are used to transfer the image pattern into the light-sensitive coating layer. Most visible and ultraviolet based systems are based on conventional Ag halide development. Thermal imaging is based on heat-induced modifications of the chemical structure of a photo-polymer that allows developing of the image in a subsequent alkaline solution bath. An example of this is the Thermal Printing Plate/830 from Kodak Polychrome Graphics. Typical sensitivities for thermal plates are on the order of 100–150 $mJ/cm^2$, which translates into substrate temperatures during exposure exceeding 650° C. Processless plates are based on ablation/vaporisation of a thin coating layer such as layer of lipophilic silver. Processless plates do not require subsequent chemical developing, but typically need even higher exposure temperatures. An example is the Mistral plate from Agfa.

A typical platesetter for direct laser imaging consists of a linear array of individually controlled laser diodes 5, 5', 5" coupled to optical fibres 25, and focussed onto the surface of the printing plate using a telecentric lens system 4 (FIG. 10(a)). Alternatively, an unfocussed laser source 5 coupled to a cylindrical lens assembly 4 and a spatial light modulator 24 such as an array of digital mirror devices or a liquid crystal array may be used. Two-dimensional spatial light modulators coupled with deflector plates can be used to enhance printing speed (U.S. Pat. No. 6,208,369). Direct laser imaging is widespread for producing printing plates for printing on paper.

It is clear from the above description that direct application of thermal printing technologies to the fabrication of electroactive transistor circuits is not possible. The exposure temperatures used in thermal imagers are not compatible with the fabrication of polymer transistor circuits. Most polymer materials degrade significantly if heated to temperatures above 250–300° C. Furthermore, in the case of electroactive circuits the layer to be patterned forms part of the circuit, and the substrate onto which the light beams are focussed may already contain a few layers of electroactive polymer materials deposited on it. In contrast, a printing plate is an intermediate carrier for the ink/toner to be transferred onto the final substrate, and the sacrificial layer that is patterned on the printing plate does not itself become part of the final image. As discussed below, these important differences impose strict temperature, stability and thickness requirements that make the fabrication of active electronic circuits significantly more challenging than that of printing plates.

The present invention and preferred aspects thereof are set out in the accompanying claims.

BRIEF DESCRIPTION OF THE DRAWINGS

The present invention will now be described by way of example, with reference to the accompanying drawings, in which.

DETAILED DESCRIPTION OF THE INVENTION

Figure 1:
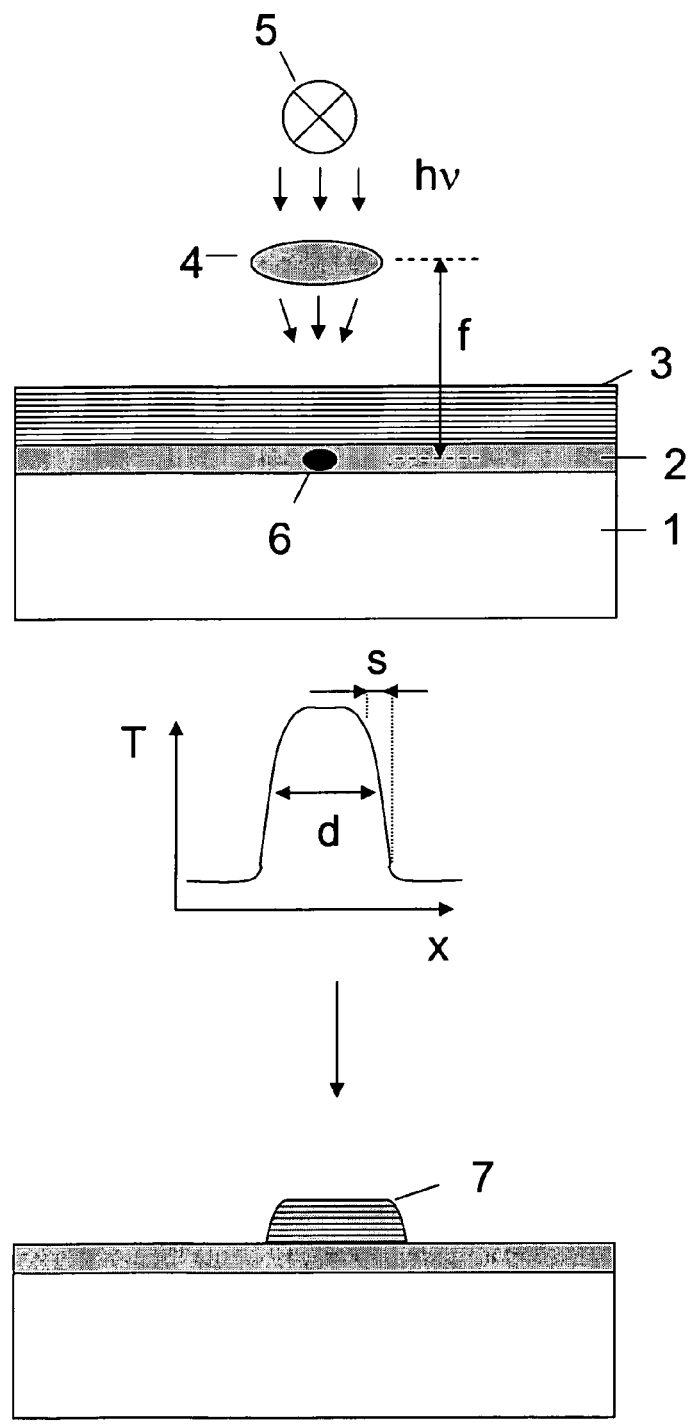
FIG. 1 shows a schematic diagram of direct writing of an electroactive polymer pattern by thermally induced solubility change using a light absorption layer.

One embodiment of the present invention relates to a low temperature laser imaging method for direct patterning of an electroactive polymer film 3 that has been coated from solution as a thin continuous film on top of a substrate 1. Suitable deposition techniques to deposit thin films from solution include spin coating, blade coating, extrusion dating or some form of printing, such as screen printing. An intense laser beam (5) of wavelength λ is focussed (4) onto the sample in order to induce a local change in the solubility properties of the electroactive polymer. Preferably, the solubility change is brought about by local heating of the polymer. Preferably, the light beam is of infrared wavelength in order to induce minimum damage to the electroactive polymer. If upon irradiation the polymer becomes insoluble in a particular solvent in which it is soluble in its unirradiated form, a pattern (7) can be produced after local exposure to radiation by washing the polymer film in a bath of this solvent. Only in those regions where the film had been exposed will polymer material remain on the substrate. Patterns can be written by scanning the laser beam across the sample.

Figure 2:
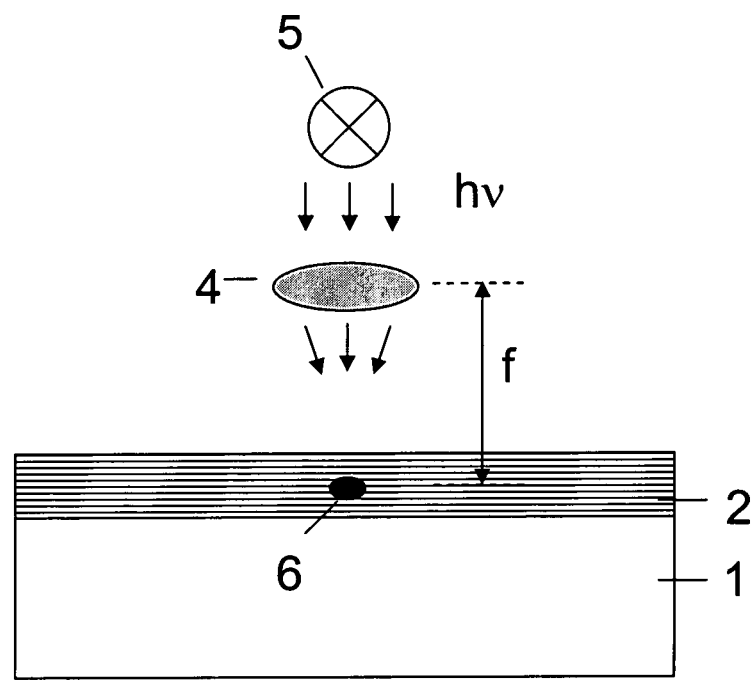
FIG. 2 shows a schematic diagram of polymer patterning by light induced solubility change without a light absorption layer.

In order to absorb the laser light efficiently a light absorbing layer (2) may be deposited in direct contact with the electroactive polymer (3) (FIG. 1). The light absorbing layer has preferably a strong absorption cross section for the laser wavelength that is used. It is preferably deposited from solution, but it is not soluble in the solvent from which the electroactive polymer is deposited. The light absorbing layer may be deposited before or after the electroactive polymer. The right absorbing layer may consist of a dye molecule mixed into a binder polymer matrix or simply a metallic film. The dye molecule may also be mixed directly into the electroactive polymer by solution deposition from a dye/polymer mixture. Alternatively, the laser wavelength may be chosen such that the light can be directly absorbed in the electroactive polymer, (3) without requiring an additional light absorption agent (FIG. 2). Many polymers have strong absorptions in the mid- and near-infrared spectral range due to infrared active intramolecular vibrations and harmonic overtones of such vibrations.

Certain electroactive polymers undergo thermally induced transformations which result in significant changes of their solubility in different solvents. An important conjugated polymer exhibiting such thermally induced changes is the conducting polymer poly(3,4-ethylenedioxythiophene) protonated with polystyrene sulfonic acid (PEDOT/PSS). The synthesis route developed by Bayer Chemical Corporation (L. B. Groenendaal, et al., Adv. Mat. 12, 487 (2000)) polymerizes ethylenedioxythiophene monomers in a water solution containing the polymeric counterion PSS. The resulting polymer solution is stable over periods of several months, such that thin films of PEDOT/PSS can easily be deposited by techniques such as spin-coating. However, after annealing to a temperature of 150–250° C. and drying of water PEDOT/PSS films are no longer soluble in water. Using local heating by focussed laser irradiation a PEDOT/PSS pattern can subsequently be developed in a bath of solvent such as water, isopropanol or acetone. Such patterns of PEDOT/PSS can be used as electrodes for polymer TFT devices. The mechanism for the thermal induced solubility change in PEDOT/PSS, which is also accompanied with a significant, desirable enhancement of film conductivity, is not fully understood at present. It may be related to thermally induced phase separation between PEDOT and PSS resulting in strong ionic interactions between positively charged PEDOT and negatively charged PSS regions in intimate contact. In the case of PEDOT/PSS infrared light can be directly absorbed in the PEDOT because of the strong polaronic absorption features in the near and mid infrared (L. B. Groenendaal, et al., Adv. Mat. 12, 487 (2000)).

Several other conjugated polymers such as semiconducting polyfluorene polymers also exhibit solubility changes due to thermally induced changes of polymer conformation in the solid state. By heating the polymer conformation can be changed locally from the high-entropy disordered state after solution coating to a lower entropy state with a more ordered or crystalline conformation. This is also found in polymers exhibiting a liquid crystalline state. In this more ordered state the solubility in most solvents is reduced, and by careful choice of the development solvent the pattern can be developed by washing away the polymer in those regions where it is in an amorphous state.

Other classes of polymers that are suitable for this patterning technique are precursor polymers that undergo thermally induced changes of the polymer backbone chemical structure, for example due to release of solubilising leaving groups at elevated temperatures, such as polyphenylenevinylene or polythienylenevinylene precursor (for a review, see for example, D. Marsitzky et al., in "Advances in Synthetic Metals", ed. P. Bernier, S. Lefrant, G. Bidan, Elsevier (Amsterdam) p. 1–97 (1999)). Typical conversion temperatures are on the order of 200–300° C.

Alternatively, crosslinking reactions may be used. In this case the polymer is mixed with a crosslinking agent that upon local heating transforms the film into an insoluble network. An example of a suitable crossslinking agent is hexamethoxymethylmelamine. As an alternative to local heating the crosslinking may be induced by using an ultraviolet light beam.

In order to protect the electroactive polymer from degradation during light exposure it is important to carefully minimize the temperature and use light of long wavelength. Most conjugated polymers degrade if heated above 300° C., and are prone to photoinduced oxidation, in particular upon visible and ultraviolet light exposure. This can be prevented by using infrared light, and by carefully minimizing the laser intensity and exposure time. In addition, the exposure may be performed under an inert atmosphere such as a gaseous nitrogen atmosphere.

The laser spot is scanned across the sample by mounting the sample on a high-precision xy-transtation stage. Alternatively, the light beam might be scanned using rotatable, motorized mirrors. Another trams atonal degree of freedom in the z-direction is required to adjust the focal point (6) of the laser spot with the layer in which the absorption of the fight is due to occur. The laser beam may be switched on and off with a suitable light shutter. In this way a polymer pattern can be directly written onto the substrate. If the mechanical stage is controlled from a Computer the pattern can be designed using a suitable software package and can then be directly transferred into the polymer films wihout requiring fabrication of a separate mask of printing plate.

WO 99/10939 A2 discloses a technique to pattern a conducting polymer film by exposure to ultraviolet light (UV) through a photomask. The photomask contains a pattern of metallized regions that block the UV light. The polymer is mixed with a crosslinking agent. In the regions where the film is exposed to UV light, a crosslinking reaction is induced which renders the polymer film insoluble, such that the polymer can subsequently be washed away in the unexposed regions. This technique is different from the one proposed here in several respects. First, it requires a separate photomask for each layer of a TFT circuit as well as for each TFT circuit layout. In the direct write technique proposed here the pattern is defined by turning on/off the different focussed laser spots and by the scanning motion of the sample underneath the laser beam. It is advantageous that the technique disclosed here does not require fabrication of a mask plate, nor does it require physical contact of the sample with a mask plate. Our technique is therefore less prone to particle contamination and abrasion. Furthermore, the method disclosed in WO 99/10939 A2 relies on a UV light-induced crosslinking reaction. In a preferred embodiment of the method disclosed here the solubility changes are induced by thermal irradiation/local heating with low-energy infrared light. UV exposure degrades many electroactive polymers through processes such as photooxidation, whereas many conjugated polymers have good thermal stability at temperatures up to 150–300° C.

In order to achieve patterns with well-defined edges the lateral intensity profile of the laser spot should be as narrow as possible. Various techniques for focussing the laser beam may be used ranging from lens focussing to more sophisticated techniques such as passing the beam through a material with a pronounced non-linear intensity dependence of the refractive index. It is possible to realize laser spots with diameters d approaching the theoretical diffraction limit determined by the wavelength of the light. It is also important that the intensity of the beam drops from its maximum to zero intensity over a distance s that should be as small as possible, i.e. s<<d. State-of-the-art thermal laser direct imagers used in the graphic arts industry achieve spot sizes of 5–10 □m. Intensity profiles that are more abrupt than that of typical Gaussian beams and decay from maximum intensity to zero intensity over length scales on the order of 1 □m or less can be achieved. Examples are the Squarespot™ plate—and trendsetter systems from Creoscitex corporation (www.creoscitex.com) or the Galileo platesetter series from Agfa (www.agfa.com).

Another aspect of the present invention relates to a surface modification layer patterned by an array of UV-lasers. The substrate is coated in a UV-sensitive surface modification layer, and imaged with an array of focussed UV-lasers. Immersing the substrate in an appropriate developer reveals the pattern.

The modification layer could be a UV-exposable polyimide layer (such as those used in conjunction with UV-photolithography for the production of LCD displays. An example of a UV-exposable polyimide is Nissan RN-901). Such UV-polyimides are well characterised, have a known optimal exposure, and can be developed in common UV-resist developers (such as Shipley MF319).

An example of a UV-laser arrays suitable for imaging the surface modification layer is the zone-plate array lithography tool (ZPAL) designed at MIT by H. I. Smith et al. (see *Lithographic Patterning and Confocal Imaging with Zone Plates* by Dario Gil, Rajesh Menon, D. J. D. Carter and H. I. Smith. To be published in the Journal of Vacuum Sciences and Technology B, November/December, 2000).

With a system such as ZPAL, surface patterning with a resolution of around 350 nm has been demonstrated using an array of laser spots over a large area (~1 mm) in a single pass of the laser array head. (*Maskless parallel patterning with zone-plate-array lithography* by D. J. D. Carter, Dario Gil, Rajesh Menon, Mark K. Mondol, H. I. Smith and E. H. Anderson. Journal of Vacuum Sciences and Technology B 17 (6), November/December, 1999).

Figure 3:
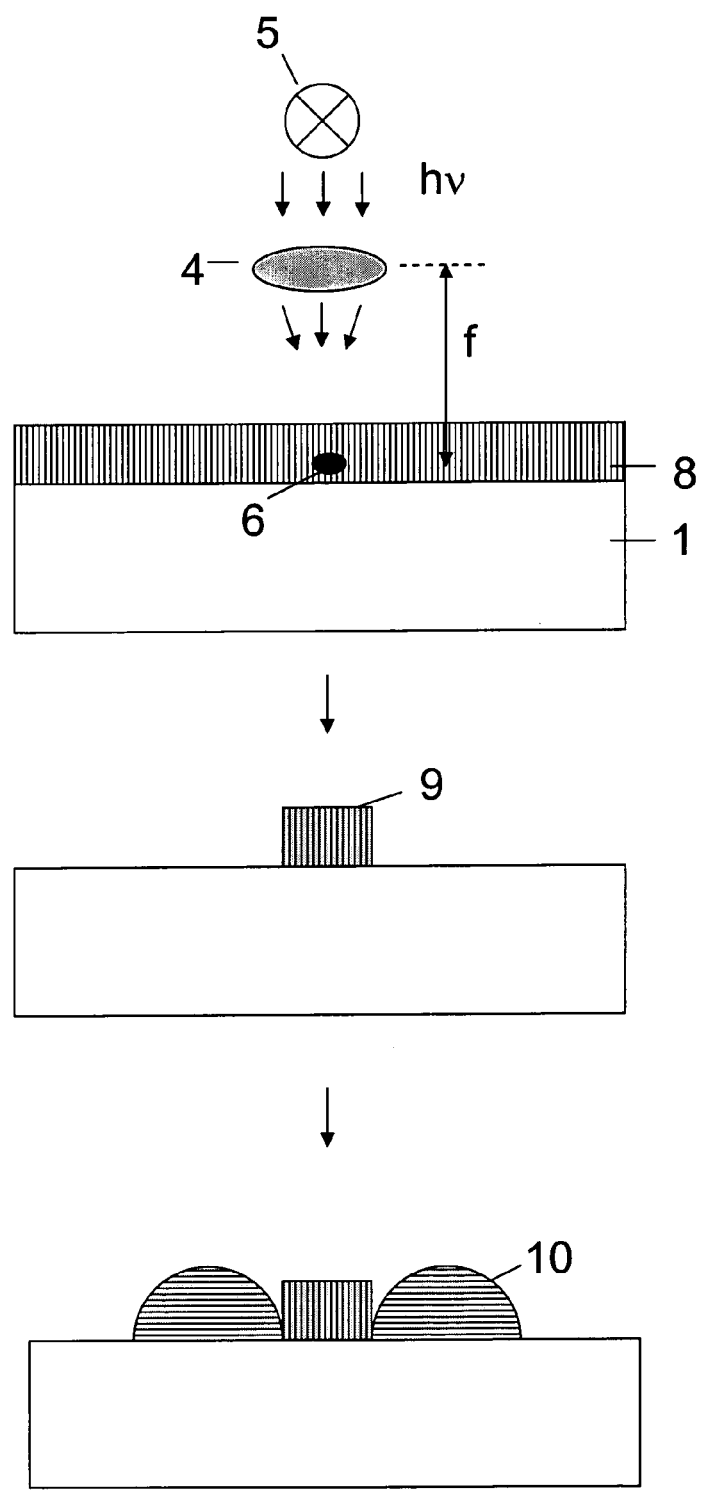
FIG. 3 shows a schematic diagram of patterning of a surface modification layer by light induced solubility change followed by direct printing of an electroactive polymer.

A second embodiment of the invention relates to a method for generating a surface free energy pattern by laser imaging that can be used to direct the deposition of an electroactive ink in a subsequent coating or printing step (FIG. 3). A continuous surface modification layer 8 is first deposited onto the substrate (1). The layer is chosen such that its surface has a different surface energy than that of the underlying substrate. For example the substrate may be hydrophilic, such as a glass substrate, and the surface modification layer may be a hydrophobic polymer such as layer of potyimide. A light absorbing agent may be deposited as well. The layer is then modified by localized heating in a similar way as described above. A possible embodiment of this invention is a layer of precursor polyimide on a glass substrate that is converted into its insoluble form by local annealing to a temperature of 200–350° C. The pattern (9) can then subsequently be developed by washing the film in a good solvent for the precursor form, such as cyclopentanone. A broad range of polyimides can be patterned in this way, including polyimide that are normally patterned by conventional etching, such as ZLI-2650 from Merck, or photoimageable poiyiimidea, such as Pyralin P12720 from HD Microsystems. Similarly, a layer of a precursor conjugated polymer such as precursor poly-phenylene-vinylene can be used. A particular attractive feature of both precursor polyimide and PPV is that they can be used as well as alignment layers for the active semiconducting polymer of the transistor (see discussion below).

Figure 4:
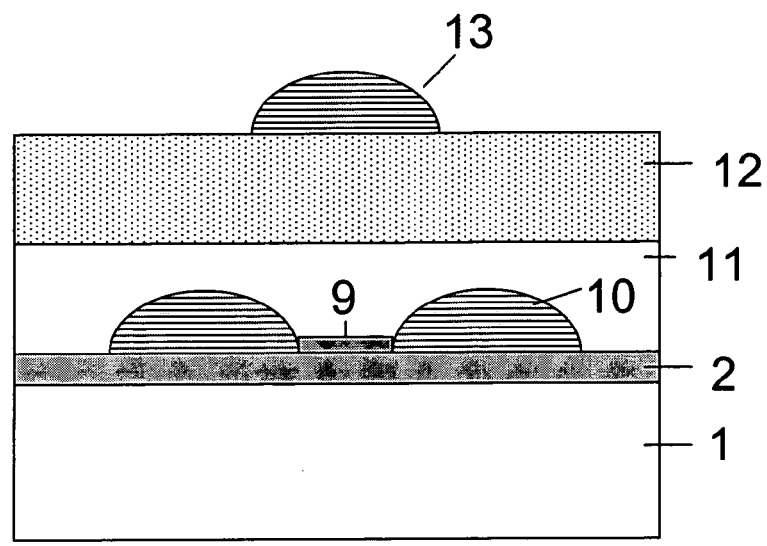
FIG. 4 shows a schematic diagram of a completed printed polymer TFT device.

By patterning of the surface modification layer a surface free energy pattern of hydrophilic and hydrophobic surface regions is generated. If such a surface energy patterned substrate is then dipped into a solution of an electroactive polymer in, for example, a polar (alternatively unpolar) solvent deposition of the electroactive polymer will only occur in the hydrophilic (alternatively hydrophobic) surface regions. Alternatively, the surface free energy pattern can be used to direct the position and flow of ink droplets (10) of the electroactive polymer depositing by direct printing such as ink-jet printing as described in UK 0009915.0. In this way a higher printing resolution can be achieved since the laser spot resolution can be significantly higher than the resolution of the inkjet printer which is limited by random variations of the droplet flight direction and variable wetting conditions on the substrate. High resolution printed patterns of conducting electroactive polymers fabricated by surface free energy patterning can be used as electrodes and interconnects of printed thin film transistor circuits (H. Sirringhaus et al., Science 290, 2123 (2000)). FIG. 4 shows a completed polymer thin film transistor after deposition of layers of semiconducting polymer 11 and dielectric polymer 12 and printing of a conducting polymer gate electrode 13 overlapping with the source-drain channel. When building up the layer structure of the TFT as shown in FIG. 4 careful choice of solvents is required in order to avoid dissolution and swelling of underlying layers. It has been shown that adequate structural integrity of the different polymer—polymer interfaces of the TFT can be achieved using an alternating sequence of polar and non-polar solvents (H. Sirringhaus et al., UK 0009911.9).

Since the surface modification layer is in direct contact with the conducting electrodes and the semiconducting layer of the TFT special care needs to be taken to ensure that the surface modification layer does not impede charge injection into the device, and that it does not contaminate the semiconducting layer. The thickness of the surface modification layer should be as thin as possible, i.e. on the order of 100–500 Å. In this way we ensure conformal coating of the thin semiconducting layer and/or other layers coated on top and a small parasitic source-drain contact resistance. In a preferred embodiment of the invention the surface modification layer is an electronic grade dielectric polymer such as polyimide that does not contain mobile low molecular weight impurity fractions, and is not soluble in the solvents that are used for the solution deposition of subsequent layers of the device.

Patterning of a surface energy pattern as described above can be achieved in the following way. A polyimide (PI2610) solution was prepared containing an ~830 nm absorbing dye (SDA8703), in the solvent N-methylpyrrolidone. Of the solids content in the solution, approximately 10% was dye and 90% polyimide. A glass substrate was spin-coated with this solution, to achieve various film thicknesses (after soft baking), all about ~100 nm. The soft bake consisted of 10 minutes on a hot plate at 80° C.

Imaging was performed at a range of laser powers and heights (to bring the laser in and out of focus). The recommended conventional curing temperature for this polyimide is 300° C. for 30 minutes, and so the aim is to ensure the polyimide briefly (and very locally) rises well above this temperature when the highly focussed laser is scanned over the substrate.

Having ascertained the correct height for focussing the laser beam on the thin film, a dose trial was performed, to see the variation in linewidth. For all of the doses tried (corresponding to a total laser power of 5 W to 12 W (380 to 910 mJ/cm$^2$), imaging was achieved, with the narrowest lines for each dose never wider than about 8 µm, and at some doses as narrow as 2 µm. The process is likely to be to some degree self-limiting. This is because the polyimide needs to be heated to a few hundred ° C. to cure, and at these temperatures the energy-absorbing dye will be bleached. Once the dye is bleached, no more energy (or very little) will be deposited in the polyimide, and the curing process stops.

Immediately after imaging, the pattern can be seen in the polyimide (without developing), since the cured areas of the film become thinner, and change colour slightly (the latter being due to the dye being bleached and the film being exposed to air during the imaging process). The patterns are developed by immersing the imaged sample in the solvent used for making the resin (N-methylpyrrolidone). The development process takes about 20 minutes at room temperature for the PI2610 polyimide (and is likely to be less for lower molecular weight polyimides). The development process is also likely to be self-limiting (samples developed for 24 hrs showed no obvious differences to those developed for 30 minutes), because the fully cured parts of the film will never dissolve in the solvent. However, it may be that partially cured films will eventually be completely dissolved from the substrate, and on one sample a large portion of the sample was completely removed by the development. In this case a tighter time restriction on development time is necessary, but in general for a fully cured film, this can be avoided.

Figure 16:
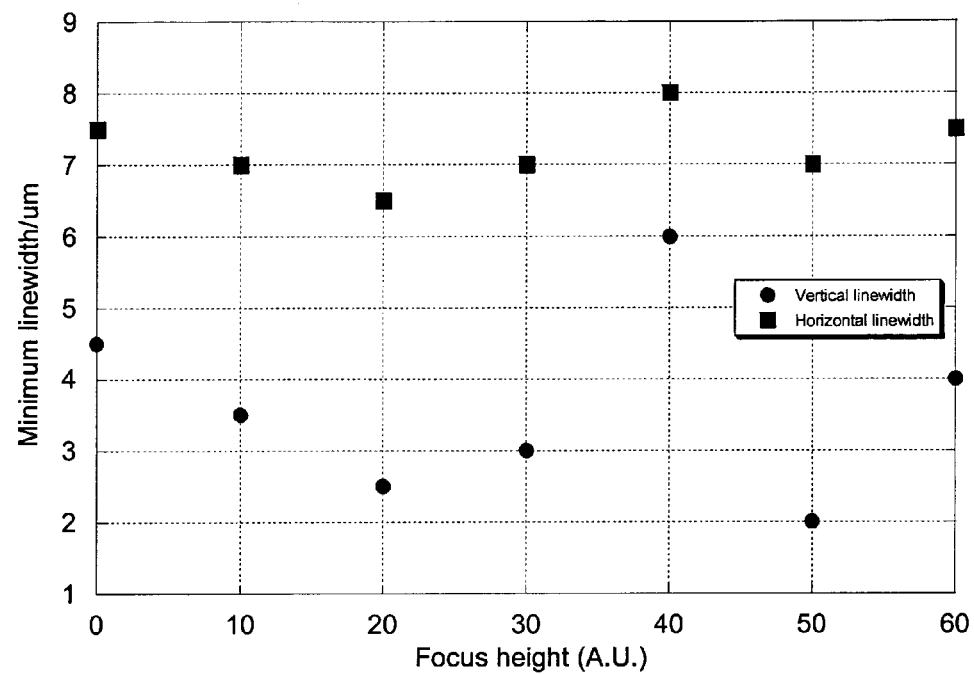
FIG. 16 shows experimental data of laser-imaged polyimide line widths for a range of focus heights, and compares the widths of lines printed horizontally and vertically. All but one data point for the vertical line widths are below 5 µm. The horizontal lines are consistently wider than the vertical lines, by up to a factor of three.
Figure 17:
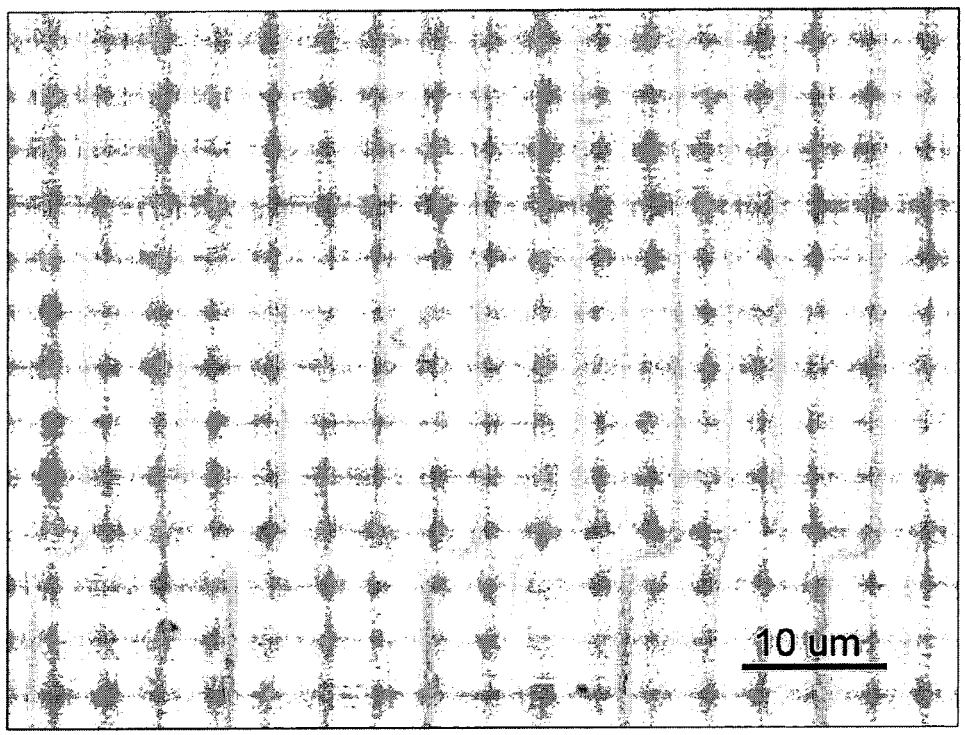
FIG. 17 shows a microscope image of laser-imaged polyimide lines, printed vertically. The vertical lines are printed with a dose of 380 mJ/cm$^2$. The line width in the top half of the figure is about 3.5 µm.
Figure 18:
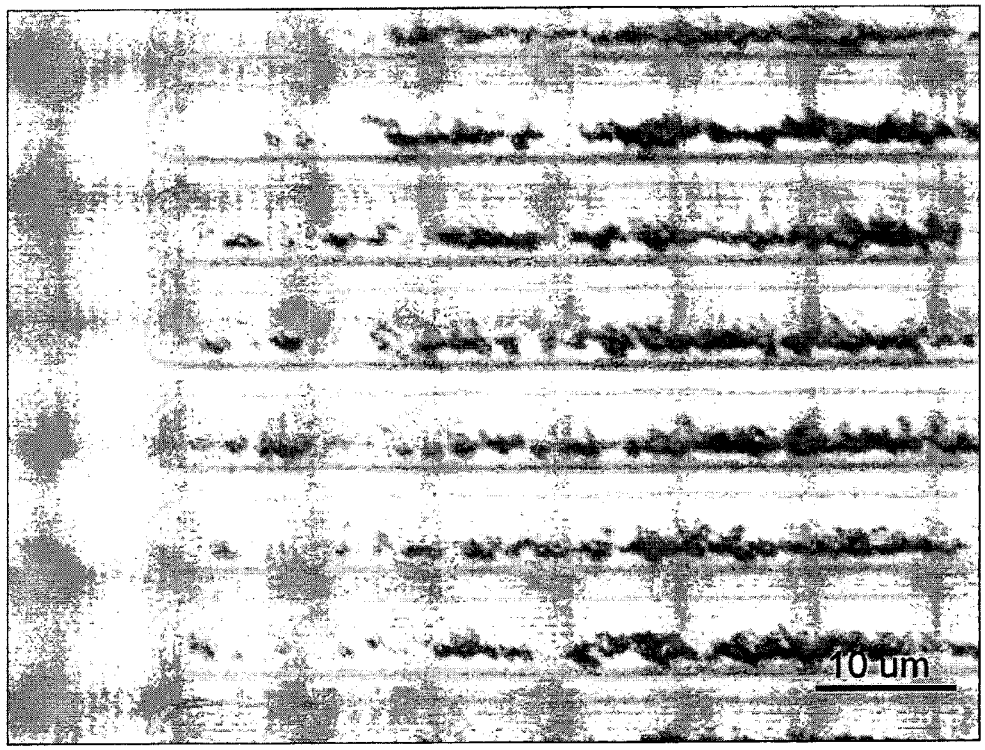
FIG. 18 shows a microscope image of laser-imaged polyimide lines, printed horizontally. The horizontal lines are printed with a dose of 380 mJ/cm$^2$ (imaged at the same time as FIG. 1). The line width is about 7 µm—twice that of the vertical lines.

The imaged pattern contained horizontal and vertical lines, intended to be 5 µm wide on a 10 µm pitch. The vertical lines were parallel to the direction of the stage motion during imaging, and the horizontal lines were perpendicular to this (so that a single vertical line could be imaged in one pass, whereas a horizontal line would need many passes, depending on its length.) A clear difference in the horizontal and vertical line widths is evident in all samples; the vertical lines are consistently narrower than the horizontal lines, by up to a factor of three (see FIGS. 16, 17 and 18).

The focus trials showed no clear trend, but the line width as a function of laser height suggested that the laser focussed at 30 (separation, arbitrary units). However, vertical lines with widths of 4 µm or less were seen at low (450 mJ/cm$^2$) and high (908 mJ/cm$^2$) doses. Often the horizontal lines showed more evidence of dye aggregating from the polyimide after exposure. This is always less evident in the vertically imaged lines, as can be seen from comparison of FIGS. 17 and 18.

Figure 19:
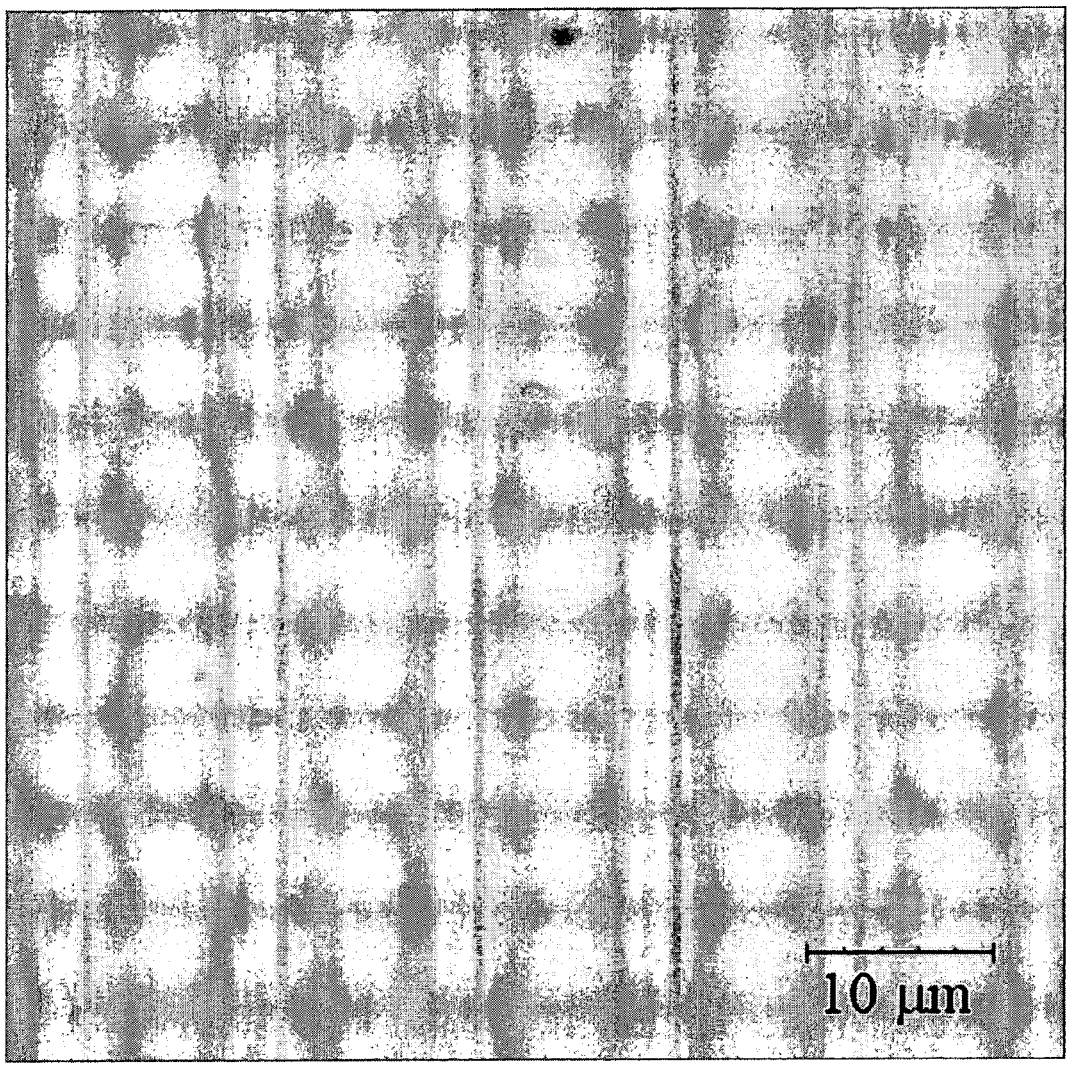
FIG. 19 shows a microscope image of the narrowest laser-imaged polyimide lines obtained. These vertically imaged lines (380 mJ/cm$^2$, developed for 20 minutes) are down to 2 µm wide.

The narrowest lines measured were achieved using a dose of 380 mJ/cm$^2$, and developed for 20 minutes. The lines are shown in FIG. 19, and have a width down to 2 µm, with good uniformity.

Figure 20:
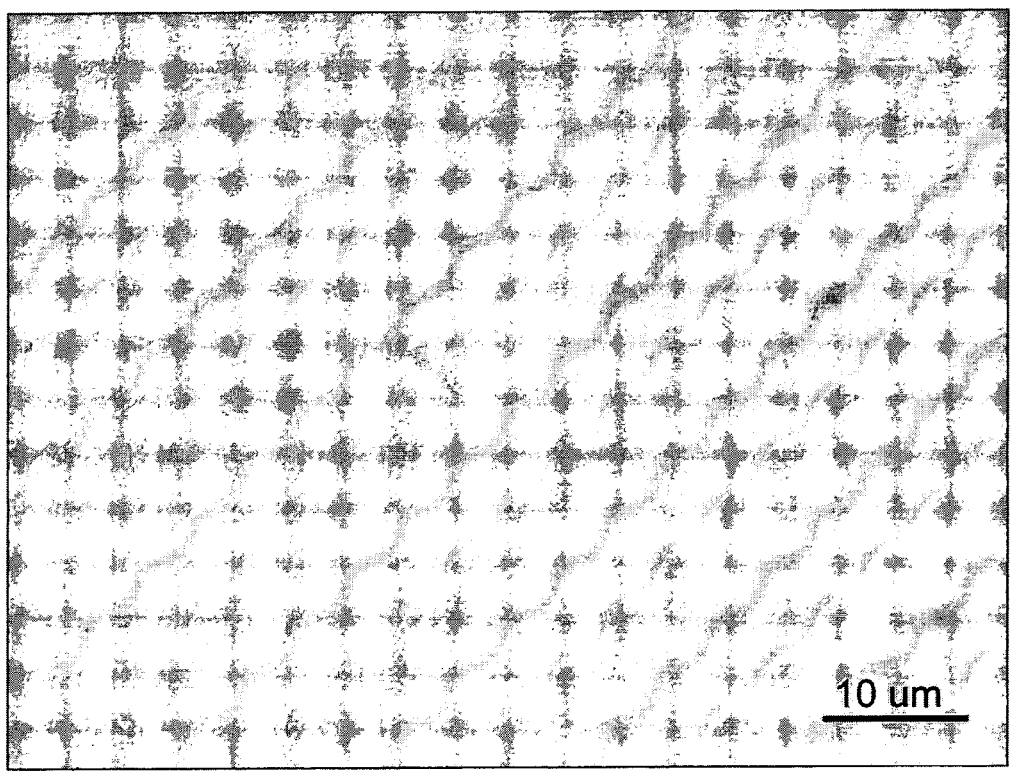
FIG. 20 shows a microscope image of diagonally laser-imaged polyimide lines. The unintentional regular sawtooth edges (caused by the laser spot size) can be used for increasing channel widths.

FIG. 20 shows some diagonally imaged lines after development. The sawtooth edge of the lines is due to the square nature of the laser spots used in the imaging. A line of this type may be useful in increasing the effective channel width in a TFT, compared to the actual length of the polyimide line.

Ink jet printing on top of the developed panels demonstrated that the polyimide formed hydrophobic regions on the glass, confining the electroactive printed polymer. This was achieved by etching the developed polyimide patterns for 1 minute in oxygen plasma before printing, in order to make the glass sufficiently hydrophilic to print the water-based polymer effectively.

Figure 21:
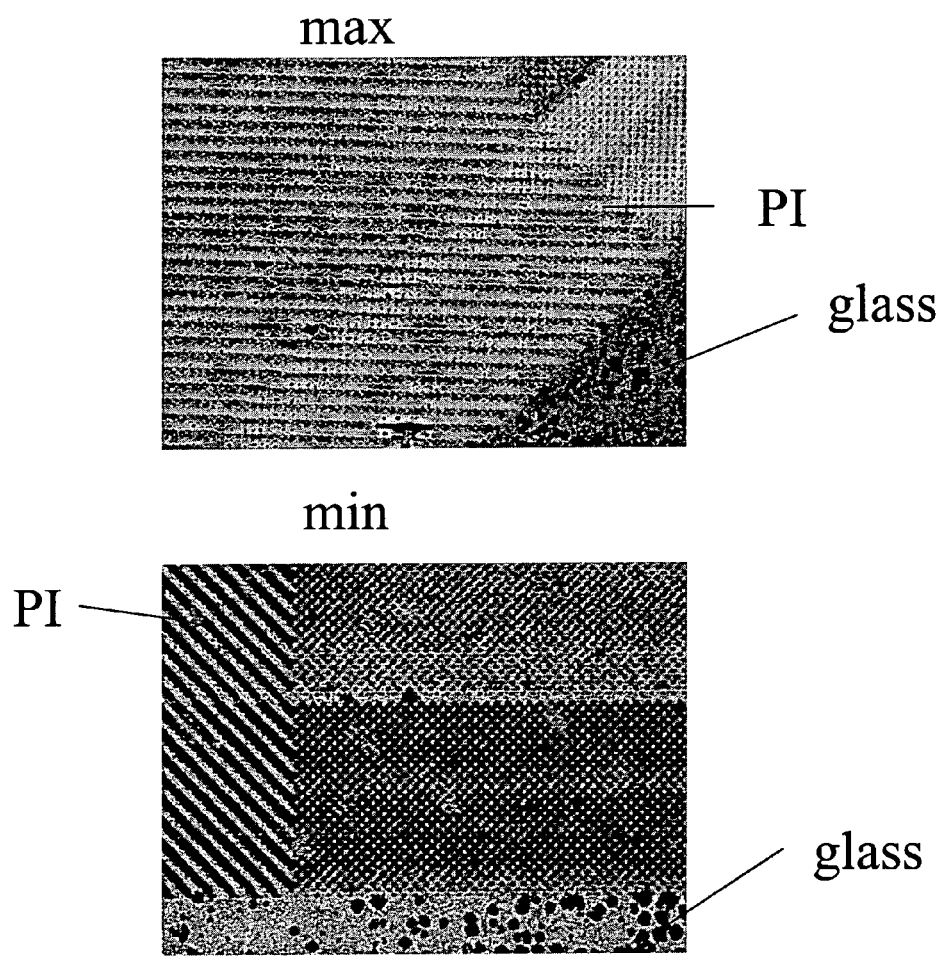
FIG. 21 shows optical microscopy images taken under crossed polarizers of the uniaxially aligned semiconducting polymer F8T2 on top of printed and rubbed polyimide lines. The regions of bright contrast are those in which F8T2 is aligned uniaxially along the rubbing direction of the polyimide lines underneath. Alignment was achieved by annealing the F8T2 film at 150° C. for 10 min.

The surface quality of the laser imaged polyimide lines is sufficiently good that semiconducting polymers can be aligned on top after mechanical rubbing of the polyimide after the patterning. This is shown for the semiconducting polymer F8T2 in FIG. 21 that was aligned on top of laser imaged & subsequently rubbed polyimide lines by bringing the polymer into a liquid crystalline phase at temperatures of 150° C. The alignment of the polymer results in an increase of TFT mobility if the chains of the F8T2 polymer are aligned parallel to the transport direction in the TFT.

Figure 5:
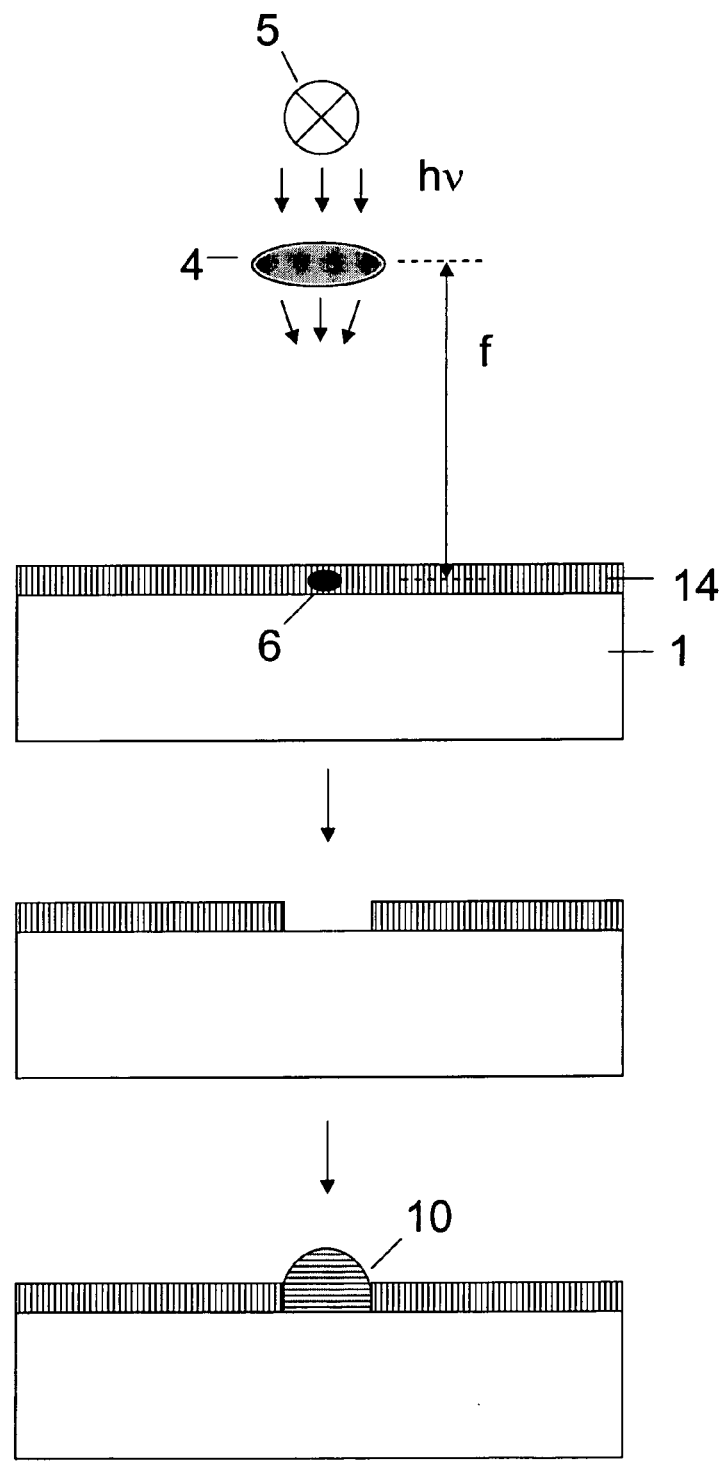
FIG. 5 shows a schematic diagram of light induced desorption of a surface modification layer followed by direct printing of an electroactive polymer.

Another embodiment of the present invention relates to a surface modification layer 14 which may also be desorbed locally from the substrate by local heating (FIG. 5). This may involve evaporation of the surface modification layer 14. However, the temperature required for evaporation needs to be sufficiently low. The surface modification layer may be a self-assembled monolayer that is covalently attached to the surface, such as a layer of alkyltrichlorosilane or hexamethyldisilazane deposited onto a hydrophilic glass substrate. The heating temperature needs to be sufficient to break the covalent bond of the molecules with the surface. An alternative is a layer of a low-molecular weight non-organic molecule such as α- or β-substituted dihexylquaterthiophene or 9,9'-dialkylfluorene monomer, which evaporate/sublime at temperatures on the order of 150–300° C.

In principle, this process may also be used to directly pattern an electroactive polymer. However, it should be noted that most electroactive polymers tend to degrade/decompose during evaporation or ablation.

Figure 6:
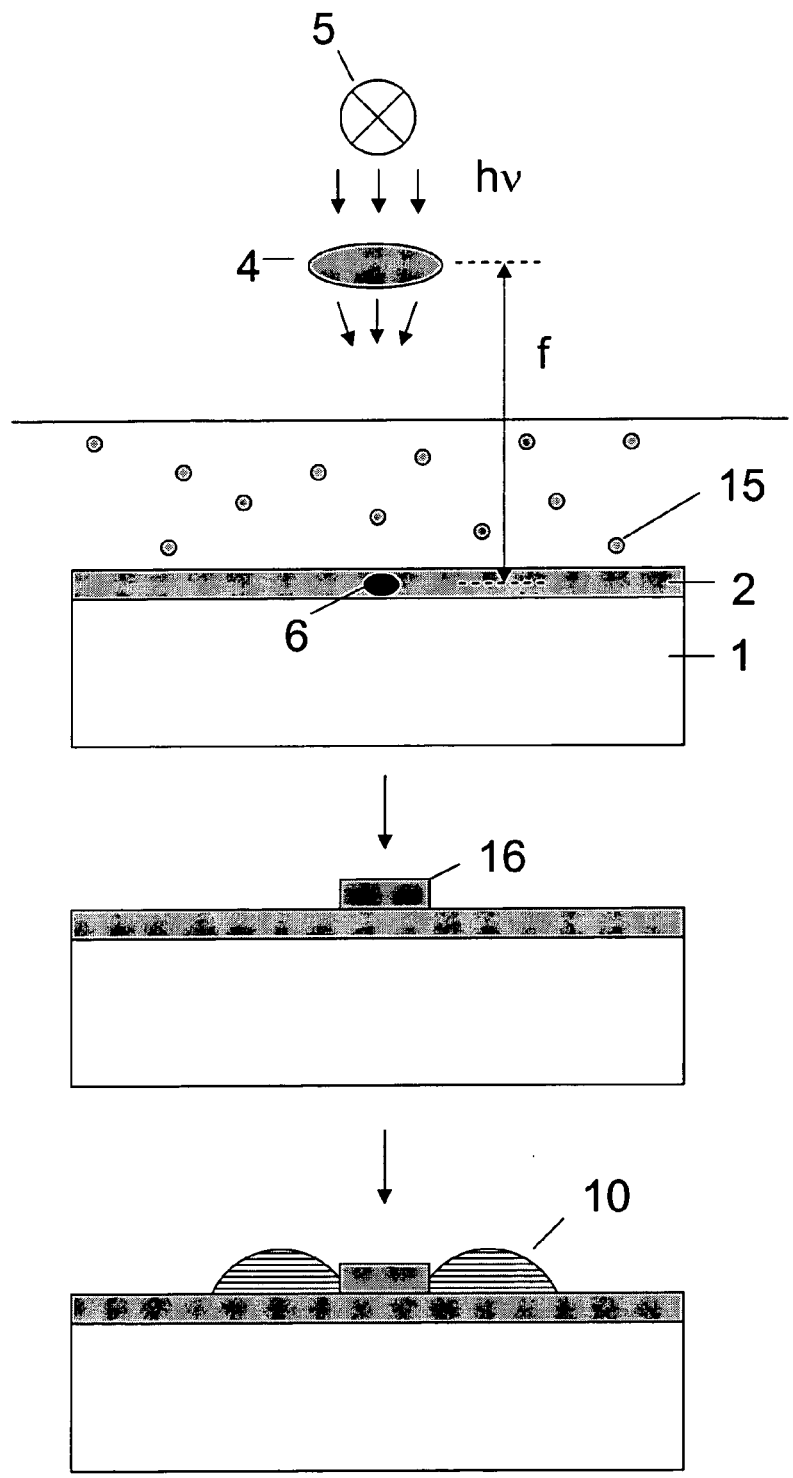
FIG. 6 shows a schematic diagram of a light promoted surface chemical reaction followed by direct printing of an electroactive polymer.

Another embodiment of the present invention relates to a method by which a surface pattern can be achieved by thermally promoting a surface chemical reaction (FIG. 6). If the substrate is immersed in a liquid or preferably gaseous environment containing molecules 15 that can undergo a thermally activated surface chemical reaction with the top layer of the substrate, a surface pattern 16 can be produced such that the chemical reaction only proceeds in those regions that are illuminated with the laser beam. One embodiment of such a process is a substrate containing a polar hydrophilic polymer as the topmost layer, such as a layer of polyvinylphenol (PVP) or a simple bare glass substrate. The polarity of the surface may be enhanced by exposure to a plasma treatment such as a radiofrequency oxygen plasma (50–250 W, 13.5 MHz for 2–5 minutes). The substrate is then immersed into an atmosphere of a self-assembled monolayer (SAM) (in air or inert nitrogen) containing an anchoring group to the substrate and a hydrophobic tail group for surface energy modification. A simple closed reactor glass vessel contains a liquid reservoir of the self-assembled molecule on the bottom in contact with a heater and a water-cooled condenser on the top of the vessel. The sample sits on a sample holder above the liquid exposed to the gaseous phase. The back of the sample may also be cooled. The vessel has a transparent window close to the sample surface through which the heating radiation enters.

For substrates that are poorly nucleophilic, such as indium tin oxide (ITO) or many polymer substrates the surface reaction with a chlorosilane or an alkoxysilane does not significantly proceed at room temperature (Koide, et al., J. Am. Chem. Soc. 122, 11266 (2000)). However, at temperatures above typically 80–100° C. it occurs rapidly and results in formation of a dense self-assembled monolayer on the hydrophilic sample surface within a few minutes. The self-assembled monolayer locally renders the surface hydrophobic, whereas in the unheated regions the surface remains hydrophilic. This surface energy pattern can be used in a subsequent printing step, for example by inkjet printing, to direct the deposition and flow of ink droplets of an electroactive polymers as discussed above. It should be appreciated that due to the low temperatures required for activation of the reaction this technique is particularly well suited for patterning steps for which the substrate already contains several layers of electroactive polymers that may not allow local temperatures to exceed 100–150° C. This is particularly attractive for patterning of the gate electrode in FIG. 4. Using a surface modification layer a narrow line of conducting polymer can be inkjet printed which minimizes the overlap capacitance between the gate and source/drain electrode.

Figure 22:
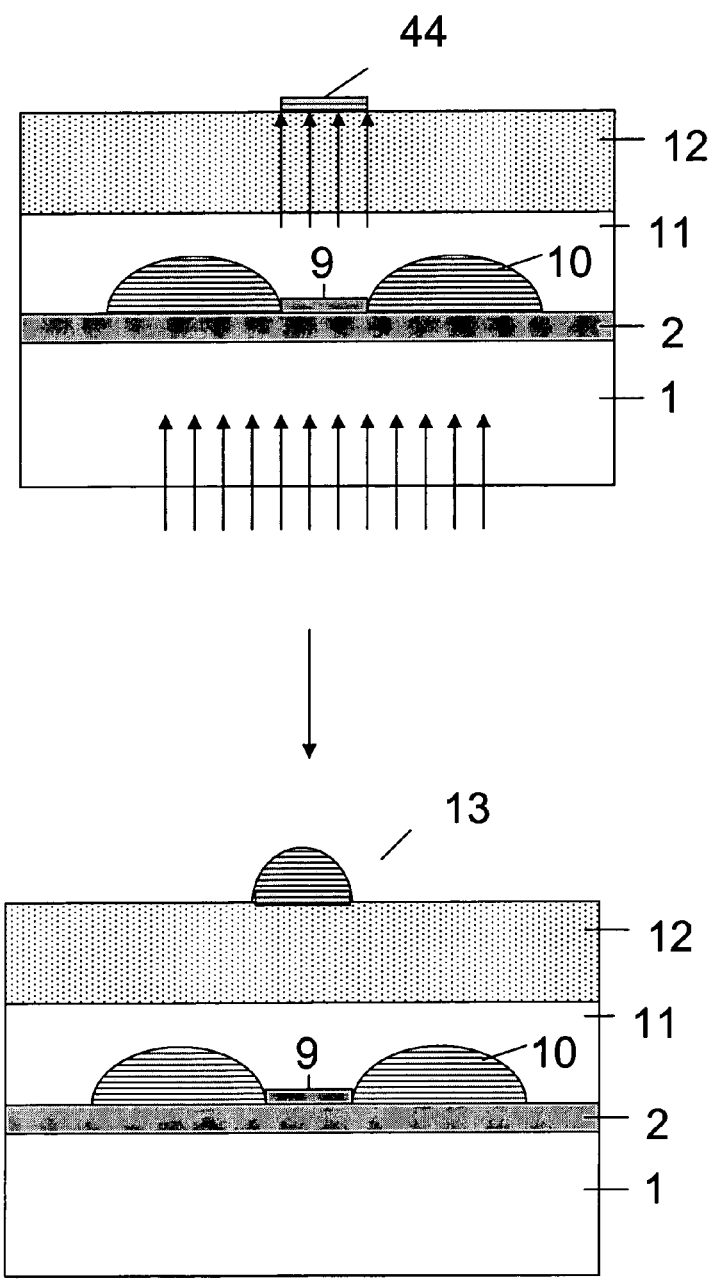
FIG. 22 shows a self-aligned process for defining a gate electrode with minimum overlap with source-drain electrodes.

For patterning on upper layers a self-aligned process might be used in which previously defined patterns are used to limit the area of the substrate that is exposed to radiation. For example, for patterning of the gate electrode of the TFT in FIG. 4 the light beam can be incident from the back of a transparent substrate, in such a way that part of the light is blocked, absorbed or at least significantly attenuated by the previously deposited source-drain electrodes. In the case of infrared light and the conducting polymer PEDOT, PEDOT is highly absorbing in the infrared. In such a way the light only modifies the upper layer in the region in between the source-drain electrodes. This process might be used for direct self-aligned patterning of the gate electrode. Alternatively, a surface modification layer 44 on top of a gate dielectric, such as a self-assembled monolayer as described above, can be patterned in this way. This is then followed by self-aligned deposition of the gate electrode material, for example by direct printing, resulting in very small overlap capacitance between source-drain and gate electrode (FIG. 22).

Other thermally activated surface reactions may be used such as grafting of polymers onto surfaces (W. T. S. Huck et al., Langmuir 15, 6862 (1999)). In this way growth of a polymer layer from the surface can be initiated locally by promoting the reaction by light absorption.

Figure 7:
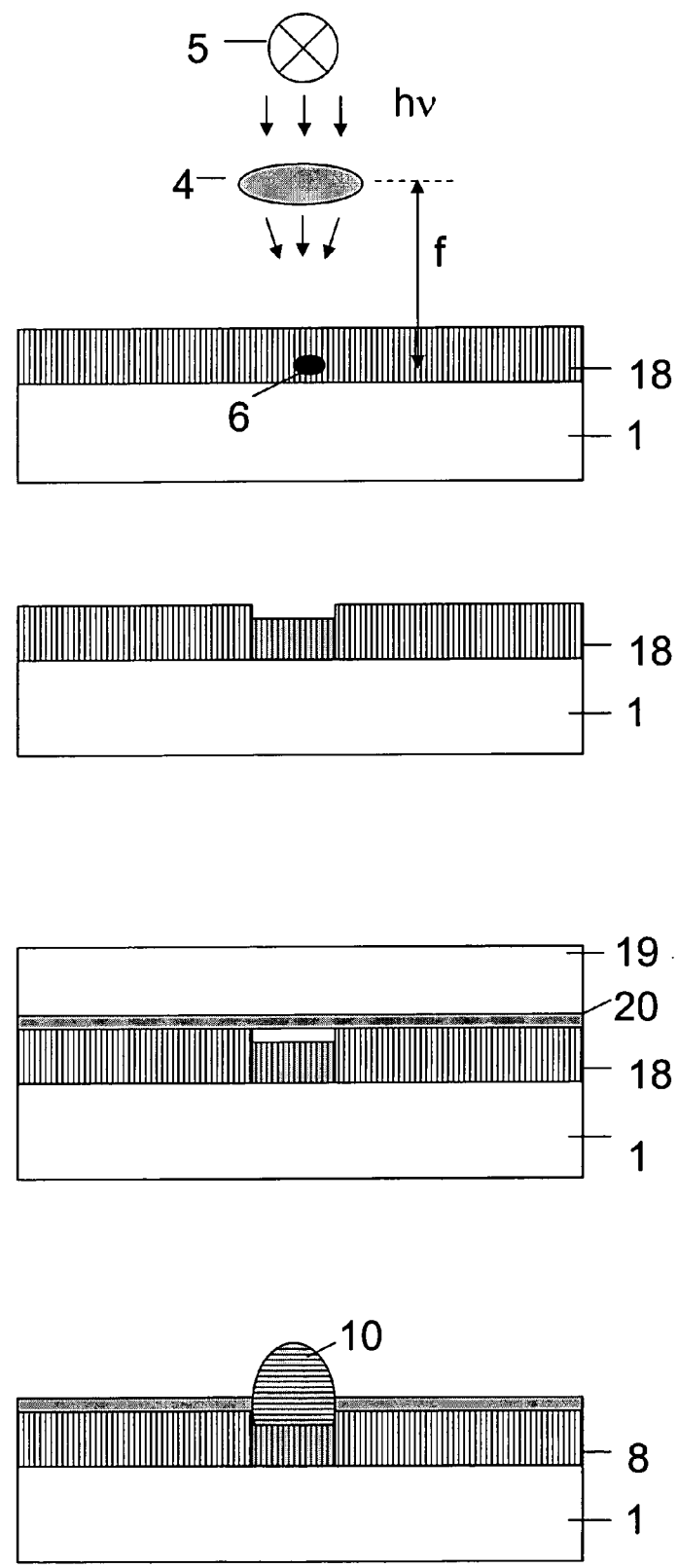
FIG. 7 shows a schematic diagram of light induced thickness changes followed by selective deposition of a self-assembled monolayer and direct printing of an electroactive polymer.

Another embodiment of the present invention relates to a method by which a thickness profile is generated in a surface layer by local heating (FIG. 7). Many polymers 18 undergo permanent volume changes upon annealing due to changes of polymer packing (for example due to crystallization), due to crosslinking, or due to desorption of volatile species. As mentioned above polyimide precursor films doped with alight absorbing dye films undergo a thickness change when exposed to infrared light induced thermal conversion. Any polymer loses weight/changes volume when annealed close to its decomposition temperature. For a particular polymer system the decomposition temperature can be determined by thermal gravimetric analysis (TGA). The thickness profile on the surface can be used to selectively modify the surface energy of the polymer surface by bringing the polymer layer in contact with a flat rubber stamp 19 inked with a self-assembled monolayer 20. This SAM pattern can be used to provide an ink confinement barrier in a subsequent printing step of the electroactive polymer. The stamp should be as flat and rigid as possible, and the applied pressure should be as low as possible in order to prevent sagging of the stamp. This technique is particularly suited to define narrow lines of width of 2–10 µm, where a small thickness contrast on the order of 1000 Å is sufficient to prevent contact between the stamp and the surface in the recessed areas.

This technique is related to soft lithographic stamping (Xia et al., Angew. Chem. Int. Ed. 37, 550 (1998)), where a soft PDMS rubber stamp with a surface relief pattern is used to selectively deposit a SAM onto a flat polymer surface. One of the disadvantages of the soft lithographic technique is the difficulty to achieve accurate registration of the SAM pattern with respect to underlying patterns and the distortion of the pattern over large areas due to the flexibility and distortion of the stamp. With the technique proposed here where the surface relief pattern is formed on the polymer surface as opposed to the stamp problems of stamp distortion can be overcome.

Figure 8:
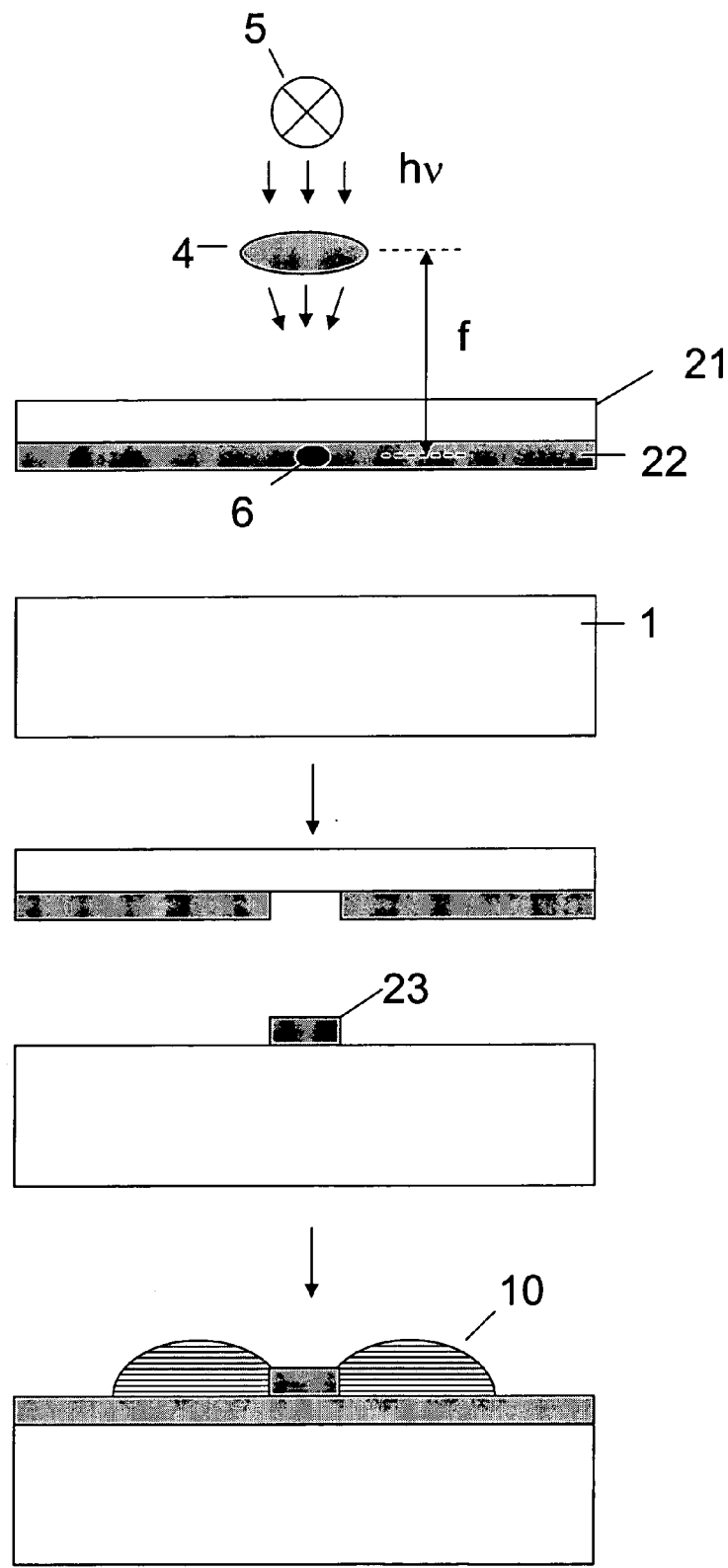
FIG. 8 shows a schematic diagram of light induced transfer of a surface modification layer followed by direct printing of an electroactive polymer.

Another embodiment of the invention relates to direct deposition of a surface modification layer 22 onto the sample substrate 1, which may be achieved by thermally stimulated transfer from a separate transfer substrate 21 (FIG. 8). The distance between the sample and the transfer substrate should be as small as possible in order to achieve accurate pattern transfer. It should be preferably less than 1 mm, most preferably less than 500 µm. Also in this case a light absorbing layer might be used between the transfer substrate and the layer(s) to be transferred. An additional release layer that loses adhesion or evaporates upon light exposure can be used in between the light absorbing layer and the release layer. This method may be used for the direct deposition of a pattern of an electroactive polymer, although special care will have to be taken for many electroactive polymers in order to avoid degradation that occurs during thermal transfer. However, the method is well suited for the deposition of a surface modification layer 23 that locally changes the surface energy and provides a barrier layer for subsequent printing of an electroactive polymer 10. A suitable release layer material may be a layer of a small organic molecule (either polar or unpolar depending onto the polarity of the sample substrate), that is solid at room temperature and atmospheric pressure, and evaporates at temperatures exceeding 100–300° C. Preferably the molecule is solution processible in order to allow low-cost coating onto the transfer substrate. An example of such a molecule would be a short conjugated oligomer with flexible side-chain substituents such as $\alpha$ or $\beta$ substituted dihexylquaterthiophene or 9,91-dialkylfluorene monomer. Note that in such a transfer process the sample substrate is not directly heated, such that this process is particularly well suited for low-temperature plastic substrates, or for substrates that already contain temperature sensitive electroactive players.

Similar considerations regarding the thickness and purity of a transferred modification layer apply as in the case of patterning a surface modification layer that is directly deposited onto the substrate.

In order to obtain a high charge carrier mobility the semiconducting polymer layer of the transistor device needs to be highly ordered, which can be achieved by making use of self-organisation mechanisms. Various self-organising semiconducting polymers can be used such as regioregular poly-3-hexylthiophene (P3HT), and polyfluorene co-polymers such as poly-9,9'-dioctylfluorene-co-dithiophene (F8T2).

Uniaxial alignment of the polymer chains parallel to the direction of current flow in the TFT is desirable in order to make optimum use of the fast intrachain transport along the polymer chain. In the case of a liquid-crystalline semiconducting polymer such as F8T2 alignment can be induced by depositing the semiconducting polymer onto a layer with an aligned molecular structure (H. Sirringhaus et al., Appl. Phys. Lett. 77, 406 (2000)), such as a mechanically rubbed or optically aligned layer of polyimide.

Uniaxial polymer alignment can also be induced by exposure to linearly polarised light. Examples of photoalignable polymers include polyimides, or polymers containing cinamate or azobenzene groups (Ichimura, Chem. Rev. 2000, 1847 (2000); Schadt et al., Nature 381, 212 (1996)). The light beam that is used for patterning can usefully be linearly polarized and that polarisation can be used to induce an aligned molecular structure of the polymer layer and simultaneously define a pattern. This technique can be used to produce a patterned and aligned surface energy barrier, such as a photoalignable polyimide, that is capable of (a) providing high printing resolution and (b) acting as an alignment layer for the subsequent deposition of the active semiconducting polymer, for example a liquid crystalline polymer. The technique can also be used to directly pattern and align a photoalignable semiconducting polymer, such as a conjugated main chain polymer containing azobenzene groups incorporated into the side chains.

In all processes described above, the substrate 1 can either be a rigid substrate, such as a thick glass substrate, or a flexible substrate, such as a thin glass substrate or a plastic substrate such as polyethyleneterephtalate (PET), polyethersulfone (PES), or polyimide (PI). For glass substrates or high temperature plastic substrates (PI) the temperature required for patterning (100–400° C.) is compatible with the temperature stability of the substrate. For low-temperature plastic substrates such as PET which distort if heated to temperatures above 150° C. the wavelength of the light should be chosen such that the substrate is transparent to the incident radiation and most of the heat is generated in the light absorbing layer. In this way high temperatures for patterning can be achieved locally without distorting the substrate.

The patterning resolution of any of the above techniques is determined by the diameter and sharpness s (FIG. 1) of the intensity profile of the laser spot. In the case of heating by infrared light it is important to control the thermal conductivity of the different layers on the substrate as well as that of the substrate itself. For most high-resolution patterning applications it is important to minimize heat conduction. This can be achieved by choosing suitable materials with low thermal conductivity, by incorporating dedicated low thermal conductivity and light non-absorbing interlayers between the layer to be patterned and the substrate and/or by operating the laser in a pulsed mode with pulse duration on the order of nanoseconds. A few intense pulses on each location will in most cases be sufficient to induce the desired thermal changes. The intensity and number of shots should be optimized in order to achieve the optimum balance between maximum pattern definition and minimum damage the materials. If thermal conduction is minimized it is possible to achieve optimum patterning resolution.

In the case of photopatterning by exposure to visible or ultraviolet light the resolution will in many circumstances be limited only by the focussing of the laser spot, which can in principle be focussed down to the wavelength $\lambda$ of the light, i.e. can be of submicrometer dimension.

Figure 9:
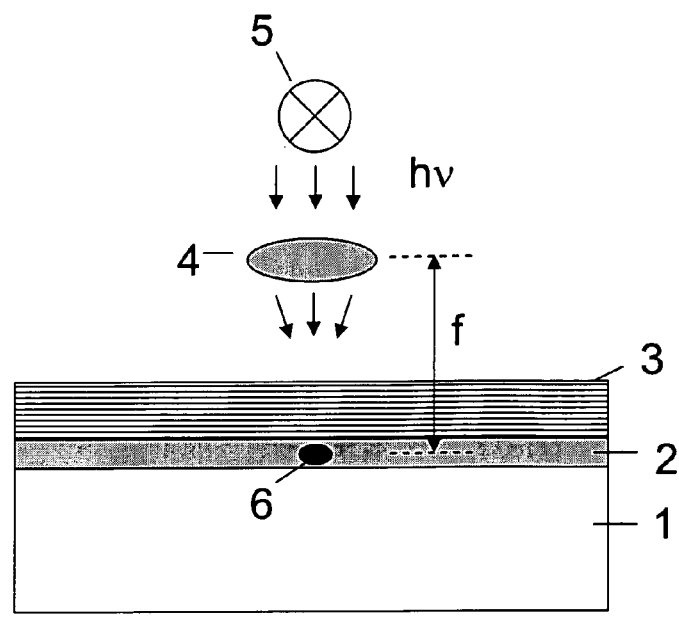
FIG. 9 shows a schematic diagram of scanning motion of the substrate underneath the laser beam to produce a pattern
Figure 9:
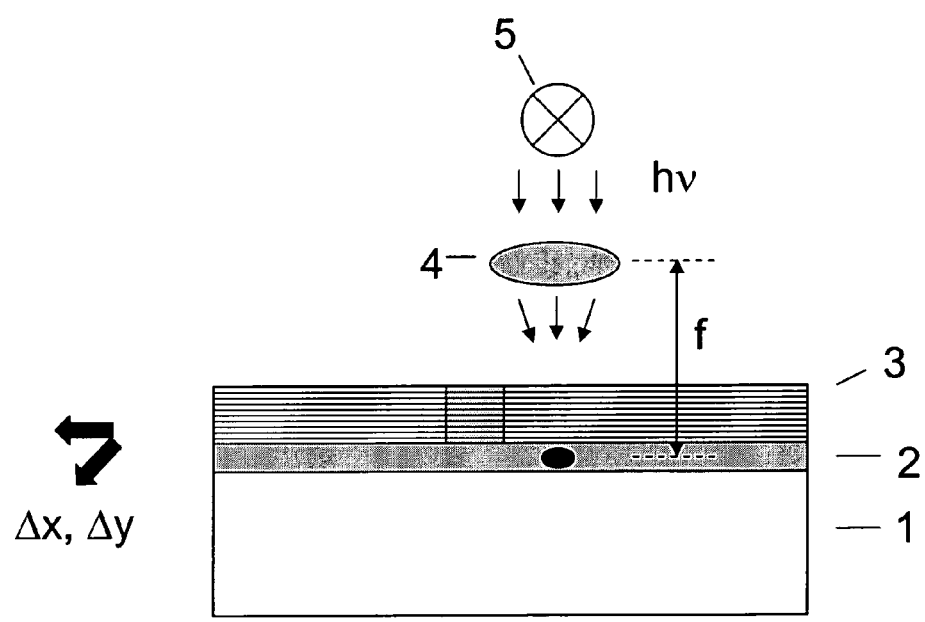
Figure 9:
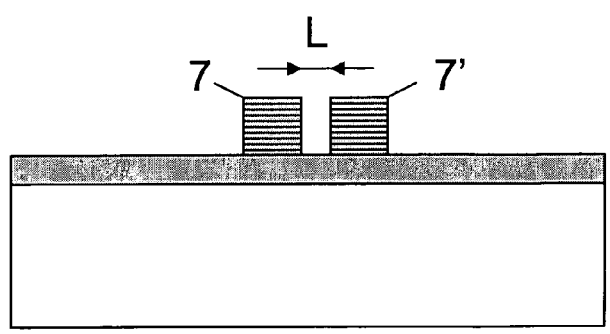

An arbitrary pattern can be defined by scanning of the beam on the sample, for example by mounting the sample on a high-precision two-dimensional translation stage (FIG. 9).

Using state-of-the-art translation stages a positioning accuracy of 0.2–0.5 µm can be achieved. Alternatively, in the case of a flexible substrate, the substrate may be attached to a rotating drum, while the laser assembly is mounted either on the inside or outside of the drum. The laser system and sample holder should be mounted in such a way as to minimize vibrations of the laser beam with respect to the sample. The minimum line width that can be written is on the order of the spot diameter d, whereas the minimum distance L between two printed lines 7, 7', is on the order of s. Using state-of-the-art thermal imaging systems produced for the graphics art industry the methods described here therefore allow direct printing of practical thin-film transistor circuits with line widths on the order of 510 µm, and minimum channel lengths of less than 2–5 µm.

Figure 10:
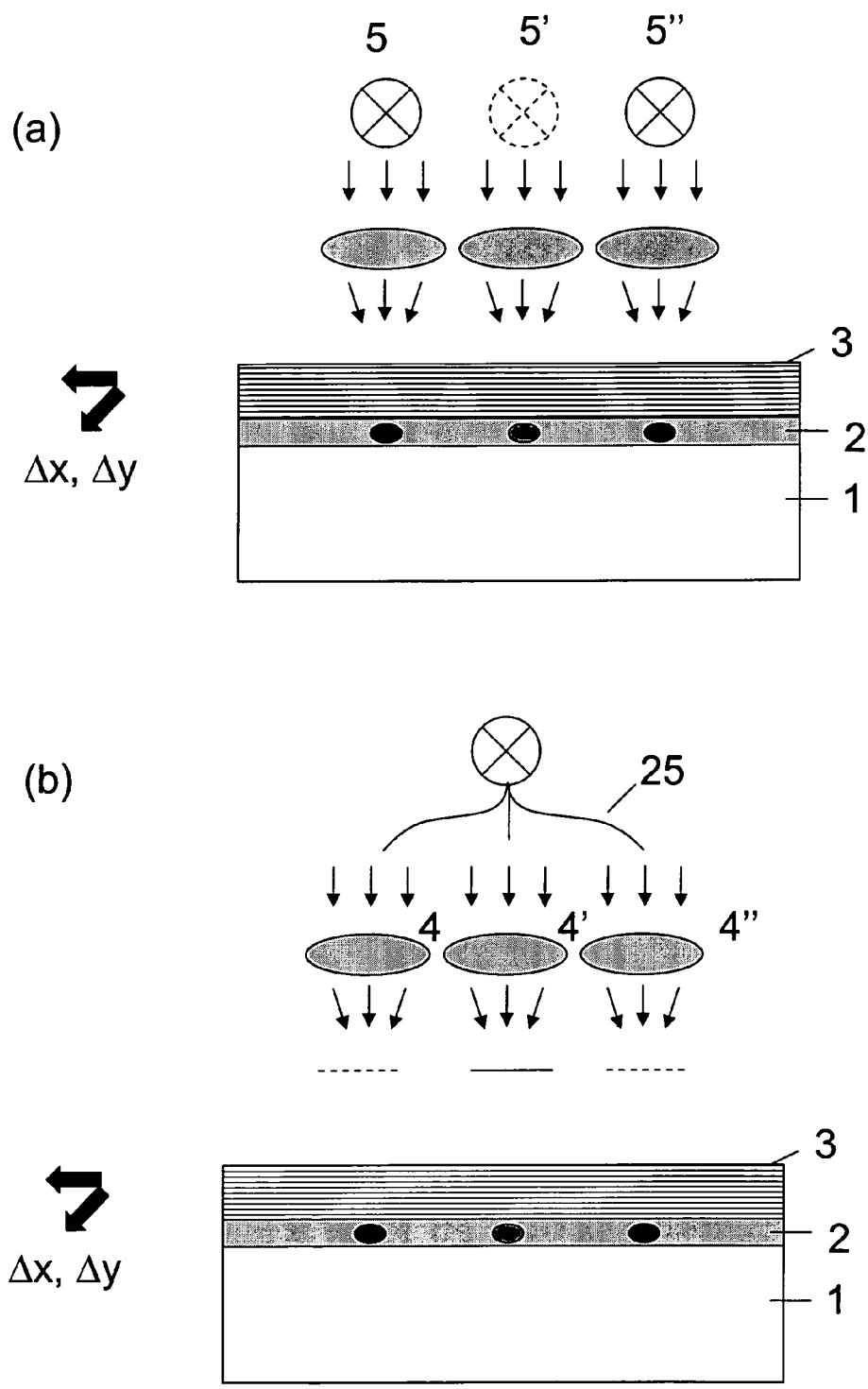
FIG. 10 shows a schematic diagram of an array of laser spots originating from an array of individual laser diodes (a) or a single laser source (b).

The throughput of the technique can significantly be increased by using a large number of laser spots in parallel (FIG. 10). The intensity profiles of the individual spots may be overlapping in the focal plane or they may be spatially separate. The former is advantageous in order to write seamless patterns over larger areas. To further enhance throughput the laser beams may be scanned, for example by deflecting the laser beam (25) with fast motorized mirrors. Techniques for high throughput laser direct imaging have been developed for printing in the graphic arts industry.

In order to achieve high throughput at low cost the manufacturing of polymer transistor circuits could be by reel-to-reel processing, in which a continuous sheet of flexible substrate is moved through a series of processing stations (FIG. 11), similar to the printing of newspaper.

Yet another embodiment of the invention relates to a method by which a complex circuit pattern can be printed from a simple surface energy pattern consisting of an array of one dimensional lines.

Figure 11:
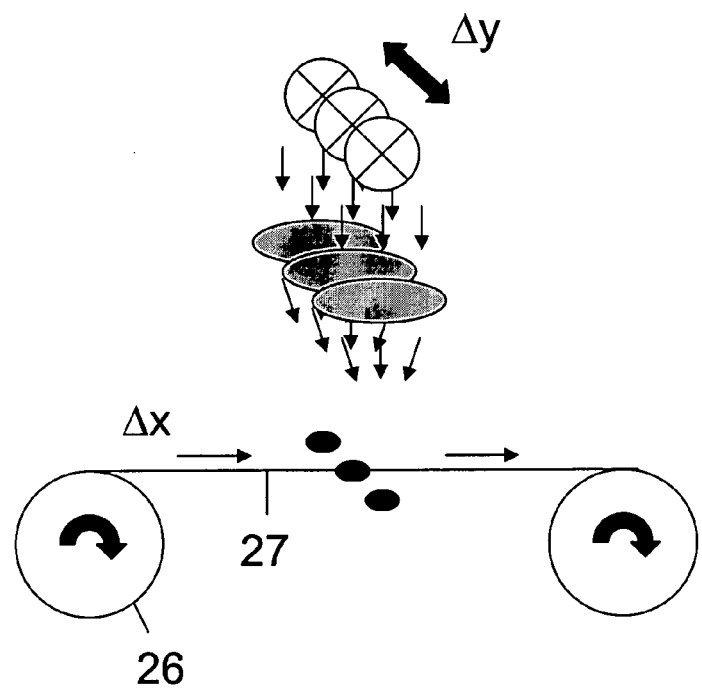
FIG. 11 shows a schematic diagram of reel-to-reel patterning of a large flexible substrate moving underneath a laser spot array.
Figure 12A:
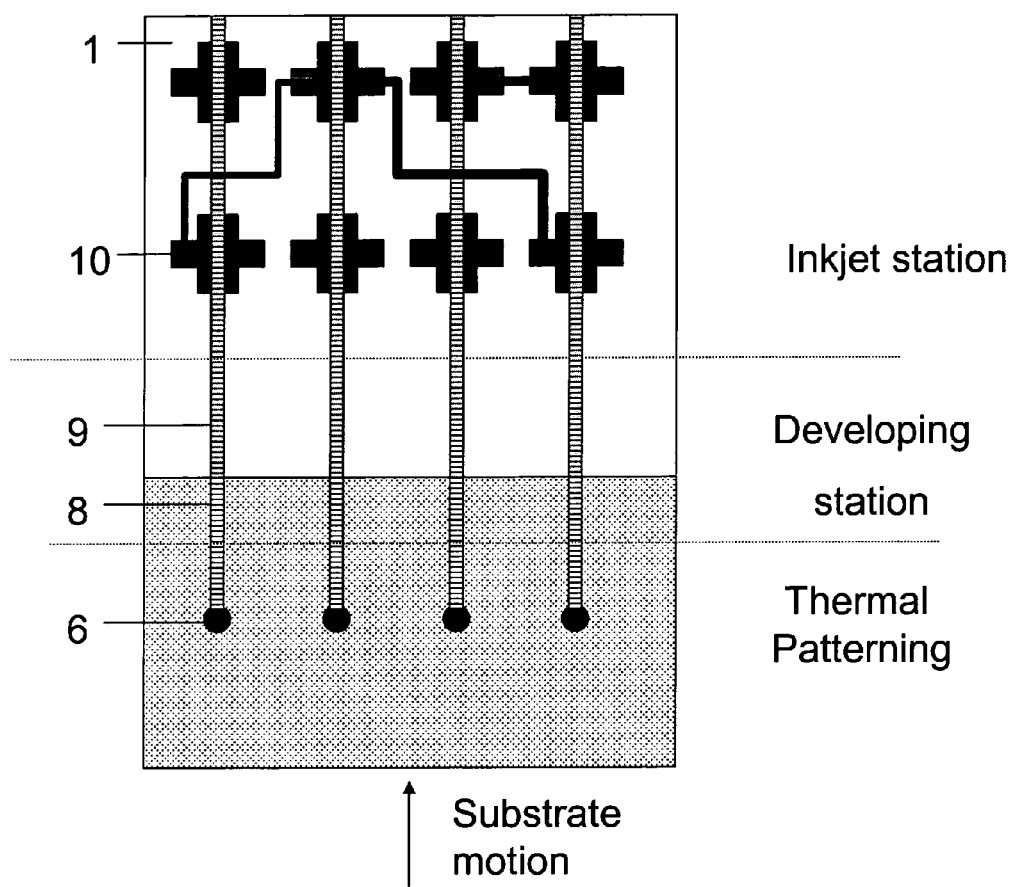
FIG. 12 illustrates the combination of fine feature definition of a surface energy pattern by thermal printing and coarse patterning by direct printing (a) with uninterrupted lines and (b) with interruptions for interconnect lines.
Figure 12B:
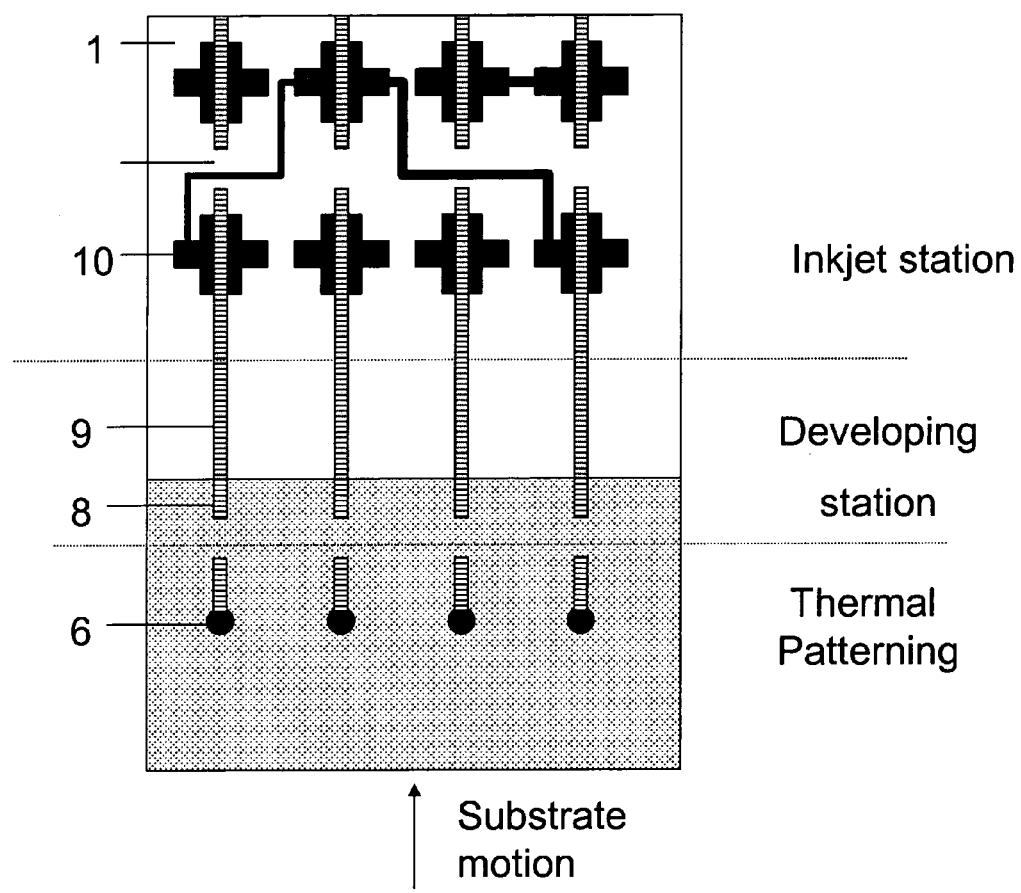

If the substrate is moved continuously underneath a linear array of focused light spots a high-resolution surface energy pattern consisting of narrow, section-wise parallel lines can be defined by one of the techniques described above (FIG. 11). In a subsequent step a complex pattern of electroactive polymer can be directly written using a lower resolution coarse printing technique, such as inkjet printing, making use of the high-resolution surface energy pattern to define all critical features (FIG. 12). This is particularly suited in cases where the circuit consists of an array of similar or identical devices interconnected in a complex way. Examples of such circuits are active matrix arrays (FIG. 13) or gate-array logic circuits. In the latter case an array of identical one-dimensional alignment features is formed with shapes adapted to the particular logic element. Another example is a simple NOR gate for which the alignment feature may, for example, have a simple U-shape. The high-resolution source-drain channels can be aligned using the surface energy pattern, and lower resolution interconnections, via-holes, and electrodes can be printed directly in arbitrary positions.

The method disclosed here is ideally suited for a reel-to-reel (26) process since the surface energy pattern can be defined by simple rolling of the flexible substrate (27) underneath the linear array of light spots in a first process station, and direct printing of the required pattern of electroactive polymer in a second process station. Intermediate steps to develop the surface energy pattern in a bath may also be included, if required (FIG. 11).

Figure 13:
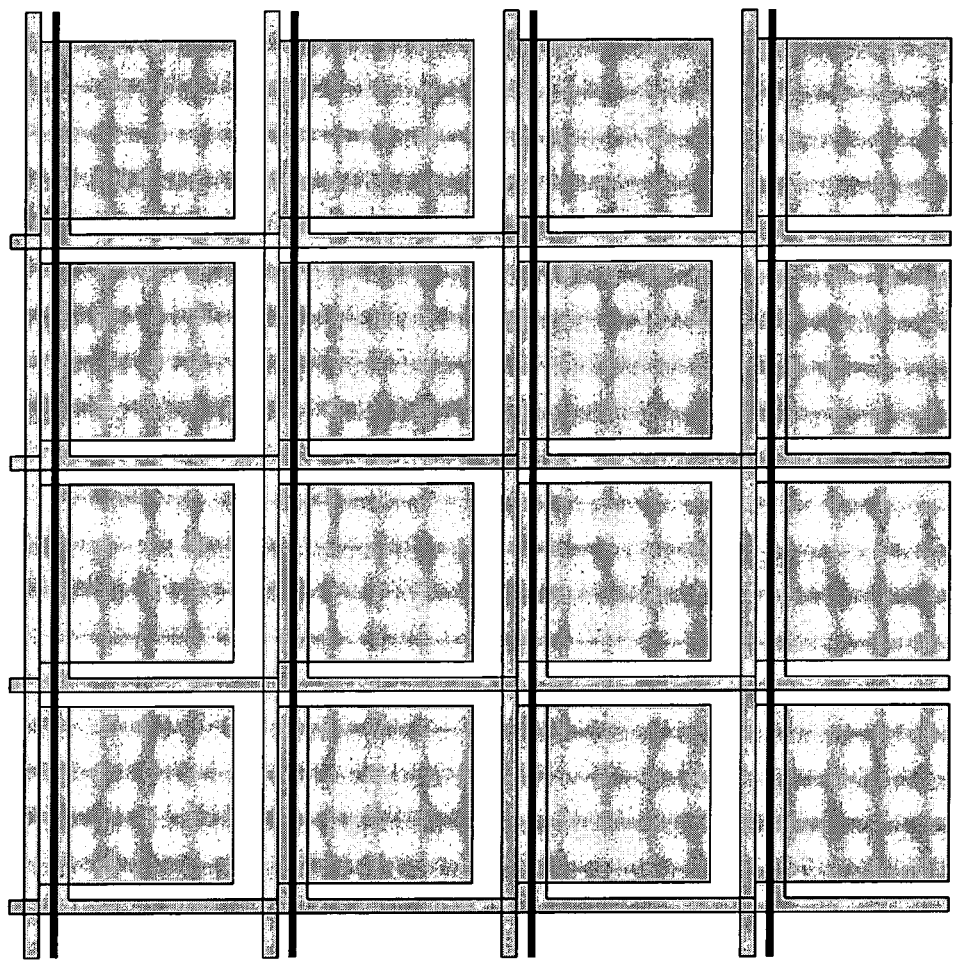
FIG. 13 shows an active matrix array of transistors with high-resolution definition of channels from a simple array of parallel surface energy barriers.

Using an array of one-dimensional, high-resolution alignment features in combination with a direct printing technique such as inkjet printing almost any circuit function can be implemented. In order to define interconnections between devices in different regions separated by one or more surface energy barriers, it is possible to simply print across a surface energy barrier (FIG. 12) by placing one or more droplets directly on top of a barrier line. Alternatively the array of one dimensional lines may be interrupted in certain regions by switching the laser beams on and off to leave space for crossing interconnection lines (FIG. 13). In general the one-dimensional alignment features do not need to be section-wise parallel. Arbitrary one-dimensional features can be written directly onto the substrate by scanning a single laser beam or by scanning an array of beams that can be individually deflected.

In many cases it will be required to align/register a printed pattern with respect to a previously printed pattern on the substrate. For example accurate registration is required for the printing of the source-drain electrodes with respect to a surface energy pattern or for the printing of the gate electrodes with respect to an underlying source-drain electrode pattern. Coarse alignment may be achieved by simply pressing the edges of the substrate against a support attached to the printer head positioning system. This mechanical alignment is mainly used in conventional offset printing.

More accurate registration may be achieved by observing the relative alignment of the substrate pattern with respect to the printer assembly with an optical inspection station, such as a high-speed, high resolution CCD camera mounted in such a way that both part of the printer head assembly and the substrate pattern are visible on the same image. Using appropriate software to analyse the images and perform automated pattern recognition the relative misalignment of the substrate pattern with respect to the print head can be determined. Accurate registration prior to printing can then be achieved by correcting the x-y position of the sample as well as its angle with respect to the printer axis.

Faster and more efficient registration can be achieved by making use of edge detection techniques. Edge detection techniques that allow the alignment of a substrate with respect to an optical printing system are disclosed in EP 10181 458 A2. They rely on measuring the transmission or reflection of a focussed light beam using an optical detector, when scanning across a surface with two surface regions having different optical properties. The light spot has a known, fixed distance from the printing position of the print head. From the steplike signal recorded by the detection system, for example, the position of the edge of the substrate can be determined automatically prior to printing.

Figure 15:
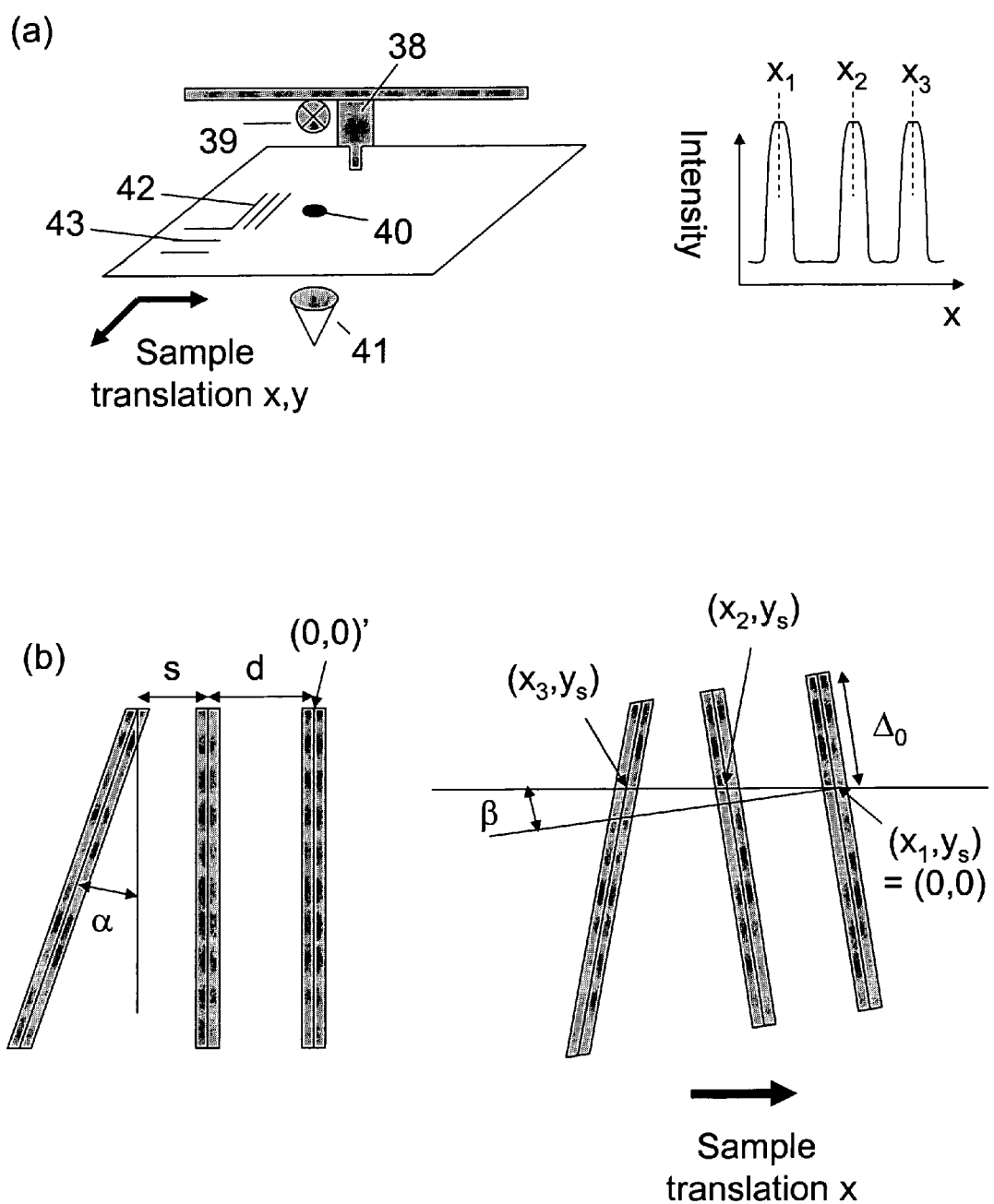
FIG. 15 shows a schematic diagram of substrate alignment by optical detection of an alignment mark underneath a moving substrate (a) and an alignment mark design that allows absolute position determination by translation in the x-direction only.

If alignment marks (42, 43) are defined in the first pattern on the substrate from a material that has a different optical absorption/reflection or emits fluorescence when excited by the focused light beam 39 at the focal point 40 thereof, the relative position of the alignment mark with respect to the printing head (38) can be determined, when scanning the sample underneath the printing head 38 and monitoring the intensity signal of the photodetector 41 (FIG. 15(a)).

Highly accurate alignment can be achieved by translating the sample in both x and y direction with patterns designed to give accurate positions in x and y, such as an array of narrow bars 42 and 43 (FIG. 15(a)).

The alignment marks can also be designed in such a way that both the position and orientation of the substrate with respect to the printhead can be determined from a single linear scan of the sample underneath the printing head, i.e. only in the x-direction. An example is shown in FIG. 15(b). In this specific case the unknown misalignment angle $\Box$ of the substrate with respect to the x-axis of the positioning system and the distance $\Box_0$ of some fixed point (0,0)' on the substrate from the center of the light spot (0,0) in the frame of reference of the positioning system can be determined from the measured position $x_1$, $x_2$, $x_3$ at which maximum signal is detected by the photodetector in the following way.

$$\cos\beta = \frac{d}{x_2 - x_1}$$

$$\frac{\cos\alpha}{\cos\alpha - \beta} = \frac{d + s + \Delta \cdot \tan\alpha}{x_3 - x_1}$$

Figure 14:
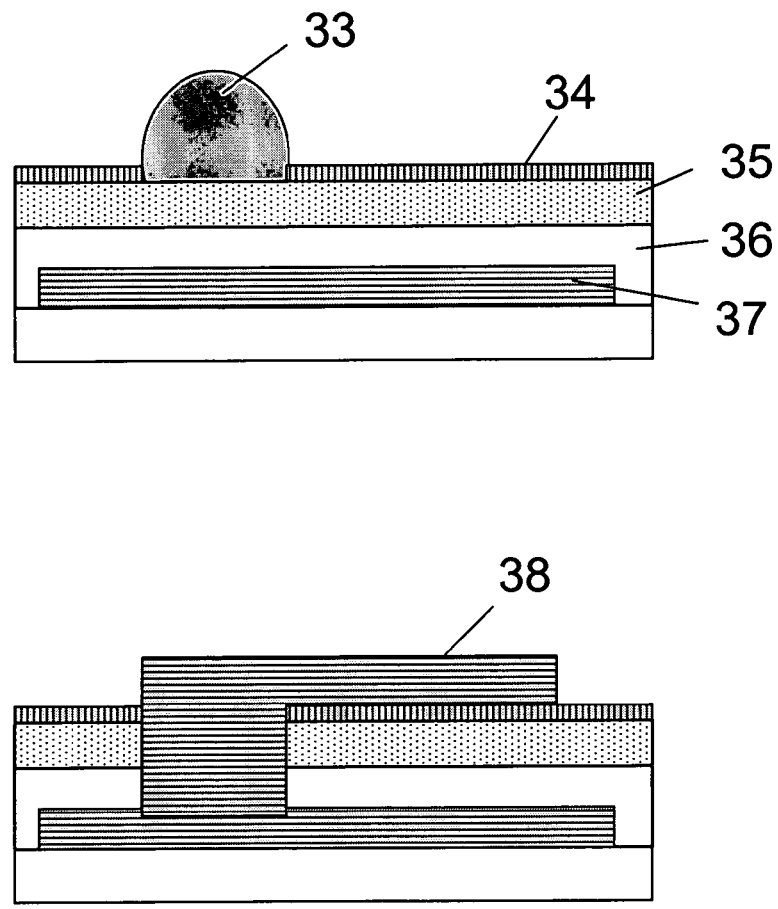
FIG. 14 shows a schematic diagram of using a surface modification layer to provide confinement for the fabrication of small via-holes by inkjet etching.

This one-dimensional scanning detection of the alignment mark position and orientation is faster than scanning in both x and y direction. It is particularly suited in situations where the y-alignment is less critical, for example for fine line features that are preferentially oriented along the y direction such as in FIG. 14.

Alternatively, if two or more light beams (and detectors) are used the position and orientation of the substrate with respect to the printing head can be determined by first scanning the head across a single alignment feature with at least two non-parallel edges, and then printing with precise alignment relative to the substrate feature. When scanning the two beams across the first edge the angle of misorientation as well as the position in the scanning direction can be determined. The position of the substrate normal to the scanning direction is obtained from the difference of time intervals between detecting the first (rising) and second (falling) edge as measured by the two beams.

When using a flexible substrate distortions of the substrate can occur between subsequent patterning steps due to thermal expansion or due to mechanical stresses. If these distortions are larger than the maximum overlap tolerance of the finest features of the circuit a single alignment process is not sufficient, and it will be required to perform the alignment locally, i.e. prior to printing each individual group of devices on the substrate. The alignment is be repeated locally during the printing process at regular intervals, depending on the degree of distortion and the required alignment accuracy.

Since scanning detection of alignment marks is fast it can be performed locally without significantly slowing down the printing process. Each group of devices can have an alignment mark next to them, oriented such that the light beam of the alignment system is first passing across the alignment mark, detects the edge, corrects its position accordingly and then starts the deposition of material at a well defined position with respect to the alignment mark to give good registration with respect to some high-resolution feature on the substrate. The position of the alignment marks should be such that little or no extra motion of the printing head is required, i.e. the scanning motion across the alignment marks should be part of the motion that is required to move the printing head from one group of features to the next. The above proposed single scan detection of position and orientation will be particularly useful to achieve fast local alignment.

On a distorted substrate scanning detection of the relative local position between a substrate feature and the printing head detects the spatial distortion pattern on the substrate. Local alignment may not need to be performed at each feature, the number of local alignment steps depends on the degree of distortion of the substrate and the required alignment tolerance. If the distortion pattern of the substrate is reproducible from one sample to the next sample, it may be sufficient to determine this characteristic distortion pattern on one substrate, and then program the positioning system for the printing head to automatically correct for the characteristic distortion on future substrates prepared under the same conditions.

Local scanning alignment can also be used in conjunction with multiple nozzle inkjet printing. In this case each printhead has an array of nozzles arranged in a regular array. In most drop-on-demand inkjet systems it is not possible to vary the droplet flight direction from each nozzle independently. Therefore, for a given degree of substrate distortion it would have to be insured that the dimension of each printhead is sufficiently small that overall local alignment of the printhead results in printing accuracy within the alignment tolerance for all nozzles on the printhead. In large format printers several heads can be mounted in parallel, and their position with respect to the substrate can be controlled individually. However, in continuous inkjet printing electrically conducting droplets from different nozzles can be deflected individually in an electrical field. In principle this would allow multiple nozzle printing with precise local alignment of each individual nozzle.

In order to form integrated TFT circuits using devices of the type described above, it is often necessary to fabricate via hole interconnects between electrodes and interconnects in different layers. Different methods to fabricate such via-holes have been demonstrated such as photolithographic patterning (G. H. Gelinck et al., Appl. Phys. Lett. 77, 1487 (2000)) or serial hole punching using a mechanical stitching machine (C. J. Drury et al., WO99/10929).

Via-holes can also be fabricated by local inkjet deposition of a good solvent for the layer through which a via-hole interconnect is to be opened (H. Sirringhaus, et al., UK0009917.6). To achieve a small size of via-holes a small ink droplet is used and the spreading of the droplet on the droplet needs to be confined.

The surface modification layer 34 patterned by the techniques described above may be used to confine the deposition of inkjet printed solvent droplets 33 that dissolve underlying polymer layers 35,36 to make contact to an underlying electrode layer 37 (FIG. 13). Such via-holes are filled subsequently by printing a conducting polymer 38. For this process it is important that the surface modification layer is not soluble in the solvent that is used for etching. If a polar solvent is used for dissolution this may be achieved by a hydrophobic self-assembled monolayer or a hydrophobic polymer layer.

In all of the above embodiments PEDOT/PSS may be replaced by any conducting polymer that can be deposited from solution. Examples include polyaniline or polypyrrole. However, some of the attractive features of PEDOT/PSS are: (a) a polymeric dopant (PSS) with inherently low diffusivity, (b) good thermal stability and stability in air, and (c) a work function of ≈5.1 eV that is well matched to the ionisation potential of common hole-transporting semiconducting polymers allowing for efficient hole charge carrier injection.

The processes and devices described herein are not limited to devices fabricated with solution-processed polymers. Some of the conducting electrodes of the TFT and/or the interconnects in a circuit or display device (see below) may be formed from inorganic conductors, that can, for example, be deposited by printing of a colloidal suspension or by electroplating onto a pre-patterned substrate. In devices in which not all layers are to be deposited from solution one or more PEDOT/PSS portions of the device may be replaced with an insoluble conductive material such as a vacuum-deposited conductor.

For the semiconducting layer any solution processable conjugated polymeric or oligomeric material that exhibits adequate field-effect mobilities exceeding $10^{-3}$ cm$^2$/Vs, preferably exceeding $10^{-2}$ cm$^2$/Vs, may be used. Suitable materials are reviewed for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)).

The electrodes may be coarse-patterned by techniques other than inkjet printing. Suitable techniques include soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939) or plating. Ink-jet printing is considered to be particularly suitable for large area patterning with good registration, in particular for flexible plastic substrates.

Although preferably all layers and components of the device and circuit are deposited and patterned by solution processing and printing techniques, one or more components such as a semiconducting layer may also be deposited by vacuum deposition techniques and/or patterned by a photolithographic process.

Devices such as TFTs fabricated as described above may be part of a more complex circuit or device in which one or more such devices can be integrated with each other and or with other devices. Examples of applications include logic circuits and active matrix circuitry for a display or a memory device, or a user-defined gate array circuit.

The patterning process may be used to pattern other components of such circuit as well, such as interconnects, resistors, capacitors etc.

The present invention is not limited to the foregoing examples. Aspects of the present invention include all novel and/or inventive aspects of the concepts described herein and all novel and/or inventive combinations of the features described herein.

The applicant draws attention to the fact that the present invention may include any feature or combination of features disclosed herein either implicitly or explicitly or any generalisation thereof, without limitation to the scope of any definitions set out above. In view of the foregoing description it will be evident to a person skilled in the art that various modifications may be made within the scope of the invention.

The invention claimed is:

1. A method for forming on a substrate an electrical device including at least one patterned layer, the method comprising:
   patterning a first layer of material on the substrate including a step of selectively exposing the first layer of material to a beam of light so as to modify a physical property of the first layer of material, and
   depositing a second layer of material over the first layer of material such that the second layer of material has a pattern of deposition influenced by the patterning of the first layer of material.

2. A method as claimed in claim 1, in which said first layer of material consists of an organic material.

3. A method as claimed in claim 1 or claim 2, wherein the method comprises selectively exposing regions of the first layer of material on the substrate to the beam of light so as to modify a solubility parameter of said first layer of material in the regions exposed to the beam.

4. A method claimed in claim 3, wherein the solubility parameters of the first layer of material is modified to render the material insoluble in a solvent in which it was soluble prior to the exposure.

5. A method as claimed in claim 4, comprising the step of washing the first layer of material to remove the material of the first layer of material in regions not exposed to the beam.

6. A method as claimed in claim 3, wherein the modification of the solubility parameter comprises causing phase separation of the material of the first layer of material and/or cross-linking of the material of the first layer of material.

7. A method as claimed in any one of claims 1 and 2, wherein the method comprises selectively exposing regions of the first layer of material on the substrate to the beam of light so as to modify a surface free energy of the material of the first layer of material in the regions exposed to the beam.

8. A method as claimed in claim 7, wherein the regions exposed to the beam are rendered unsoluble by the beam, and comprising the step of removing regions unexposed to the beam so as to uncover a surface of the underlying substrate, having a surface free energy different to that of the first layer of material.

9. A method as claimed in claim 7 or claim 8, wherein the second layer of material is deposited from solution in a solvent such that the second layer of material has a pattern of deposition influenced by the regions of modified surface free energy of the first layer of material.

10. A method as claimed in claim 9, wherein the solvent from which the material of the second layer of material is deposited is selected so that the material of the second layer of material is inhibited from being deposited in the regions of modified surface free energy of the first layer of material.

11. A method as claimed in claim 9, wherein the solvent from which the material of the second layer of material is deposited is selected so that the material of the second layer of material is inhibited from being deposited in the regions of the first layer of material in which the surface free energy is unmodified by the beam.

12. A method as claimed in any one of claims 1 and 2, wherein the method comprises selectively exposing the first layer of material on the substrate to the beam of light so as to remove the material of the first layer of material in regions exposed to the beam.

13. A method as claimed in claim 12, wherein the material of the first layer of material is desorbed and/or evaporated in the regions exposed to the beam.

14. A method as claimed in any one of claims 1 and 2, wherein the method comprises contacting the first layer of material on the substrate with a reactive medium and selectively exposing the first layer of material to the beam of light so as to promote a chemical reaction between the material of the first layer of material and the reactive medium in regions exposed to the beam.

15. A method as claimed in claim 14, wherein the reactive medium is comprised in the first layer of material.

16. A method as claimed in claim 14, comprising the step of applying the reactive medium in gas or liquid form to a surface of the first layer of material.

17. A method as claimed in any one of claims 14, 15 and 16, wherein the chemical reaction is such as to modify solubility and/or a surface free energy and/or an electrical property of the material of the first layer of material in regions exposed to the beam.

18. A method as claimed in any one of claims 1 and 2, wherein the method comprises selectively exposing the first layer of material on the substrate to the beam of light so as to modify the volume of that layer in regions exposed to the beam.

19. A method as claimed in claim 1, wherein the beam is a focussed beam.

20. A method as claimed in claim 1, wherein the beam is such as to cause local heating of the first layer of material in the regions exposed to the beam.

21. A method as in claim 20, wherein the local temperature of the substrate in the region exposed to the beam does not exceed 350° C. during exposure to the beam.

22. A method as in claim 20, wherein the local temperature of the substrate in the region exposed to the beam does not exceed 200° C. during exposure to the beam.

23. A method as in claim 20, wherein the local temperature of the substrate in the region exposed to the beam does not exceed 120° C. during exposure to the beam.

24. A method as in claim 1, wherein the thickness of the first layer of material is less than 1 μm.

25. A method as claimed in claim 1, wherein the first layer of material forms a conducting electrode of the electrical device.

26. A method as claimed in claim 1, wherein the first layer of material forms a semiconducting layer of the electrical device.

27. A method as claimed in claim 1, wherein the first layer of material forms a dielectric layer of the electrical device.

28. A method as claimed in claim 1, wherein the first layer of material forms a surface modification layer of the electrical device.

29. A method as claimed in claim 1, wherein the beam has a width less than 10 μm.

30. A method as claimed in claim 1, wherein the beam has a width of less than 1 μm.

31. A method as claimed in claim 1, wherein the beam is a laser beam.

32. A method as claimed in claim 1, wherein the beam is a beam of infra-red light.

33. A method as claimed in claim 1, wherein the beam is of visible light.

34. A method as claimed in claim 1, wherein the beam is of ultraviolet light.

35. A method as claimed in claim 1, comprising moving the beam across the first layer of material to perform the said selective exposing and define a desired pattern.

36. A method as claimed in claim 1, wherein the beam is a beam of polarised light.

37. A method as claimed in claim 36, wherein exposing the first layer to the beam causes photoalignment of the material of the first layer of material to form a photoaligned layer.

38. A method as claimed in claim 37, wherein the photoalignment of the material of the first layer of material is simultaneous with the patterning of the first layer of material.

39. A method as in claim 34 or 38, second layer of material is one which acquires an aligned molecular structure in contact with the photoaligned layer.

40. A method as in claim 39, wherein the second layer of material is a liquid crystalline conjugated polymer layer.

41. A method as claimed in claim 1, wherein the first layer of material is the said patterned layer of the electrical device.

42. A method as claimed in claim 41, wherein the first layer of material is an active layer of the electrical device.

43. A method as claimed in claim 1, wherein the second layer of material is the said patterned layer of the electrical device.

44. A method as claimed in claim 43, wherein the second layer of material is an active layer of the electrical device.

45. A method for forming on a first substrate an electrical device including at least one patterned layer, the method comprising:
selectively exposing a first layer of material on a second substrate to a beam of light so as to bring about transfer of a pattern of the first layer of material onto the first substrate, and
depositing a second layer of material over the pattern of the first layer of material on the first substrate such that a pattern of deposition of the second layer of material is influenced by the pattern of the first layer of material.

46. A method as claimed in claim 45, wherein the layer of material on the second substrate is the said patterned layer of the electrical device.

47. A method as claimed in claim 46, wherein the layer of material on the second substrate is an active layer of the electrical device.

48. A method as claimed in claim 46, in which the layer of material is a surface modification layer.

49. A method as in claim 1 where the electronic device is an electronic switching device.

50. A method as in claim 1 wherein the electronic device is a thin film transistor device.

51. A method as claimed in claim 1 in which a portion of the light beam is blocked or attenuated by a previously deposited pattern on the substrate, so as to bring about modification of the first layer of material on the substrate only in the regions in which the light is not blocked or attenuated.

52. A method as claimed in claim 1, in which a portion of the focussed light beam is blocked or attenuated by a previously patterned third layer of material on the substrate, so as to bring about modification of said first layer of material on the substrate only in the regions in which the light is blocked or attenuated.

53. A method as claimed in claim 52, in which said previously patterned third layer of material forms the source and drain electrodes of an electronic switching device.

54. A method as claimed in claim 53, in which said first layer of material forms the gate electrode of an electronic switching device.

55. A method as claimed in claim 51 or 52, wherein the second layer is deposited onto said first layer of material so as to confine the deposition of to a region in which the light beam was not blocked or attenuated.

56. A method as claimed in claim 1, wherein the second layer of material is deposited from a liquid such that the second layer of material has a pattern of deposition influenced by the pattern in the first layer of material defined by the light exposure.

57. A method as claimed in claim 45, wherein the second layer of material is deposited from a liquid such that the second layer of material has a pattern of deposition influenced by the pattern in the first layer of material defined by the light exposure.

* * * * *